United States Patent
Ishida et al.

(10) Patent No.: US 12,094,883 B2
(45) Date of Patent: Sep. 17, 2024

(54) DISPLAY DEVICE

(71) Applicant: SHARP KABUSHIKI KAISHA, Sakai (JP)

(72) Inventors: Izumi Ishida, Sakai (JP); Masatomo Honjo, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 402 days.

(21) Appl. No.: 17/603,234

(22) PCT Filed: Apr. 15, 2019

(86) PCT No.: PCT/JP2019/016210
§ 371 (c)(1),
(2) Date: Oct. 12, 2021

(87) PCT Pub. No.: WO2020/213042
PCT Pub. Date: Oct. 22, 2020

(65) Prior Publication Data
US 2022/0190000 A1 Jun. 16, 2022

(51) Int. Cl.
*H01L 27/12* (2006.01)
*H01L 21/02* (2006.01)
(Continued)

(52) U.S. Cl.
CPC .... *H01L 27/1225* (2013.01); *H01L 21/02565* (2013.01); *H01L 27/124* (2013.01);
(Continued)

(58) Field of Classification Search
CPC . H01L 21/02554; H01L 21/02; H01L 21/768; H01L 21/82345; H01L 27/1288; H01L 27/12; H01L 27/0605; H01L 27/127; H01L 29/42384; H01L 29/423; H01L 29/66969; H01L 29/66; H01L 29/7869;
(Continued)

(56) References Cited

U.S. PATENT DOCUMENTS 9,087,749 B2 * 7/2015 Hara .................... H01L 29/4908
9,368,491 B2 * 6/2016 Ellinger .............. H01L 27/0705
(Continued)

FOREIGN PATENT DOCUMENTS

JP 2006-520490 A 9/2006
JP 2009-224812 A 10/2009
(Continued)

*Primary Examiner* — Nikolay K Yushin
(74) *Attorney, Agent, or Firm* — ScienBiziP, P.C.

(57) ABSTRACT

A display device, includes: a first gate electrode; a lower insulating film; a lower gate insulating film including a metal oxide film; and an oxide semiconductor layer, all of which are provided on a substrate in a stated order; and a first transistor provided on the substrate and including the oxide semiconductor layer, the first transistor including one or more first transistors, the first transistor including: a first channel region; a first conductor region holding the first channel region; and the first gate electrode across the lower gate insulating film from the first channel region, and between the lower insulating film and the first gate electrode, a clearance being provided, and the clearance being filled with the lower gate insulating film.

18 Claims, 14 Drawing Sheets

(51) Int. Cl.
*H01L 29/423* (2006.01)
*H01L 29/66* (2006.01)
*H01L 29/786* (2006.01)

(52) U.S. Cl.
CPC ........ *H01L 27/1255* (2013.01); *H01L 27/127* (2013.01); *H01L 27/1288* (2013.01); *H01L 29/42384* (2013.01); *H01L 29/66969* (2013.01); *H01L 29/7869* (2013.01)

(58) Field of Classification Search
CPC ... H01L 29/786; H01L 29/4908; H01L 29/49; H01L 29/78636; H01L 21/02565; H01L 21/02365; H01L 27/1225; H01L 27/124; H01L 27/1255
See application file for complete search history.

(56) References Cited

U.S. PATENT DOCUMENTS

| | | |
|---|---|---|
| 2005/0285102 A1 | 12/2005 | Koo et al. |
| 2006/0208979 A1 | 9/2006 | Fish et al. |
| 2007/0268438 A1 | 11/2007 | Nakamura et al. |
| 2009/0278120 A1 | 11/2009 | Lee et al. |
| 2011/0057192 A1 | 3/2011 | Nakamura et al. |
| 2014/0014950 A1 | 1/2014 | Hara et al. |
| 2016/0126101 A1 | 5/2016 | Ellinger |
| 2018/0175077 A1 | 6/2018 | Koo et al. |

FOREIGN PATENT DOCUMENTS

| | | |
|---|---|---|
| JP | 2018-151630 A | 9/2018 |
| WO | 2006/022259 A1 | 3/2006 |
| WO | 2012/090432 A1 | 7/2012 |
| WO | 2018/163019 A1 | 9/2018 |

\* cited by examiner (a) CROSS-SECTION F-F (b) CROSS-SECTION G-G (c) CROSS-SECTION H-H

DISPLAY DEVICE

TECHNICAL FIELD

The disclosure relates to a display device.

BACKGROUND ART

In producing display devices, a known technique to form a gate insulating film involves applying, using a spin coater or a slit coater, a material (hereinafter referred to as an applicable material) to a substrate provided with wiring (see Patent Document 1).

CITATION LIST

Patent Literature

[Patent Document 1] Japanese Unexamined Patent Application Publication No. 2009-224812 (published on Oct. 1, 2009)

SUMMARY

Technical Problem

The gate insulating film needs to be thin to achieve high mobility of a transistor. Such a thin gate insulating film causes a problem of a possible decrease in breakdown voltage of a display device because of the reason below.

Applied to the substrate using a spin coater or a slit coater, the applicable material tends to lie flat. Hence, when the spin coater or the slit coater is used to apply the applicable material to the substrate in order to form the gate insulating film, a portion, of the gate insulating film, above the wiring is formed thinner than any other portion of the gate insulating film. When the portion, of the gate insulating film, above the wiring is thin, the gate insulating film becomes excessively thin on an edge of the wiring, possibly causing a decrease in breakdown voltage of the transistor.

An aspect of the disclosure is to provide a display device having sufficient breakdown voltage, while film thickness of a gate insulating film is small.

Solution to Problem

A display device according to an aspect of the disclosure includes: a first gate electrode; a lower insulating film; a lower gate insulating film containing a metal oxide film; and an oxide semiconductor layer, all of which are provided on a substrate in a stated order; and a first transistor provided on the substrate and including the oxide semiconductor layer, the first transistor including one or more first transistors. The first transistor includes: a first channel region; a first conductor region holding the first channel region; and the first gate electrode across the lower gate insulating film from the first channel region. Between the lower insulating film and the first gate electrode, a clearance is provided. The clearance is filled with the lower gate insulating film.

Advantageous Effects of Disclosure

An aspect of the disclosure can provide a display device having sufficient breakdown voltage, while film thickness of a gate insulating is small.

DESCRIPTION OF EMBODIMENTS

Display Device

Figure 1:
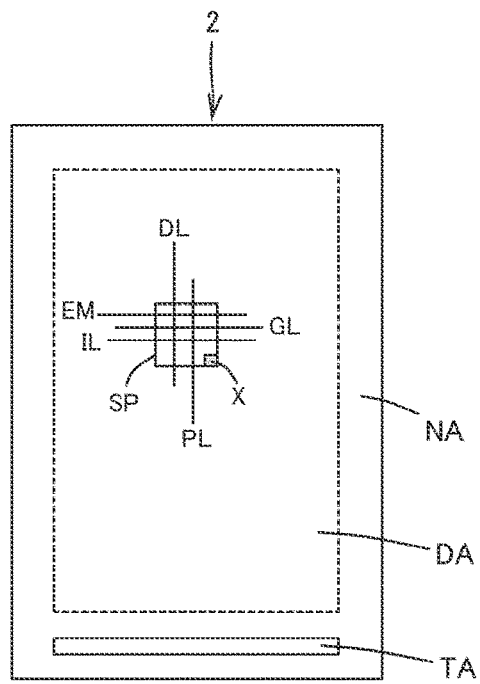
FIG. 1 is a schematic plan view illustrating a configuration of a display panel in a first embodiment.

FIG. 1 is a schematic plan view illustrating a configuration of a display panel in this embodiment. As illustrated in FIG. 1, a display device 2 includes a display region DA and a frame region NA surrounding the display region DA.

In the display region DA, a light-emitting element X and a pixel circuit of the light-emitting element X are provided for each of sub-pixels SP. This pixel circuit and a wire connected to the pixel circuit are formed in a thin-film transistor layer. Examples of the wire to be connected to the pixel circuit include, for example, a scanning signal line GL, a light-emission control line EM, an initialization power source line IL, a data signal line DL, and a high-voltage power source line PL. The pixel circuit includes: a drive transistor to control a current of the light-emitting element X; and a write transistor and an initialization transistor electrically connected to the scanning signal line GL.

The frame region NA includes: driver circuits (not shown) each provided to either side of the display region DA; and a terminal unit TA. An external substrate is mounted on the terminal unit TA.

The display device 2 is formed of: the thin-film transistor layer including the pixel circuits and various wires (such as the scanning signal lines GL and the data signal lines DL); a light-emitting element layer including the light-emitting elements X; and a sealing layer blocking foreign substances, all of which are stacked on top of another on a base material.

First Embodiment

Figure 2:
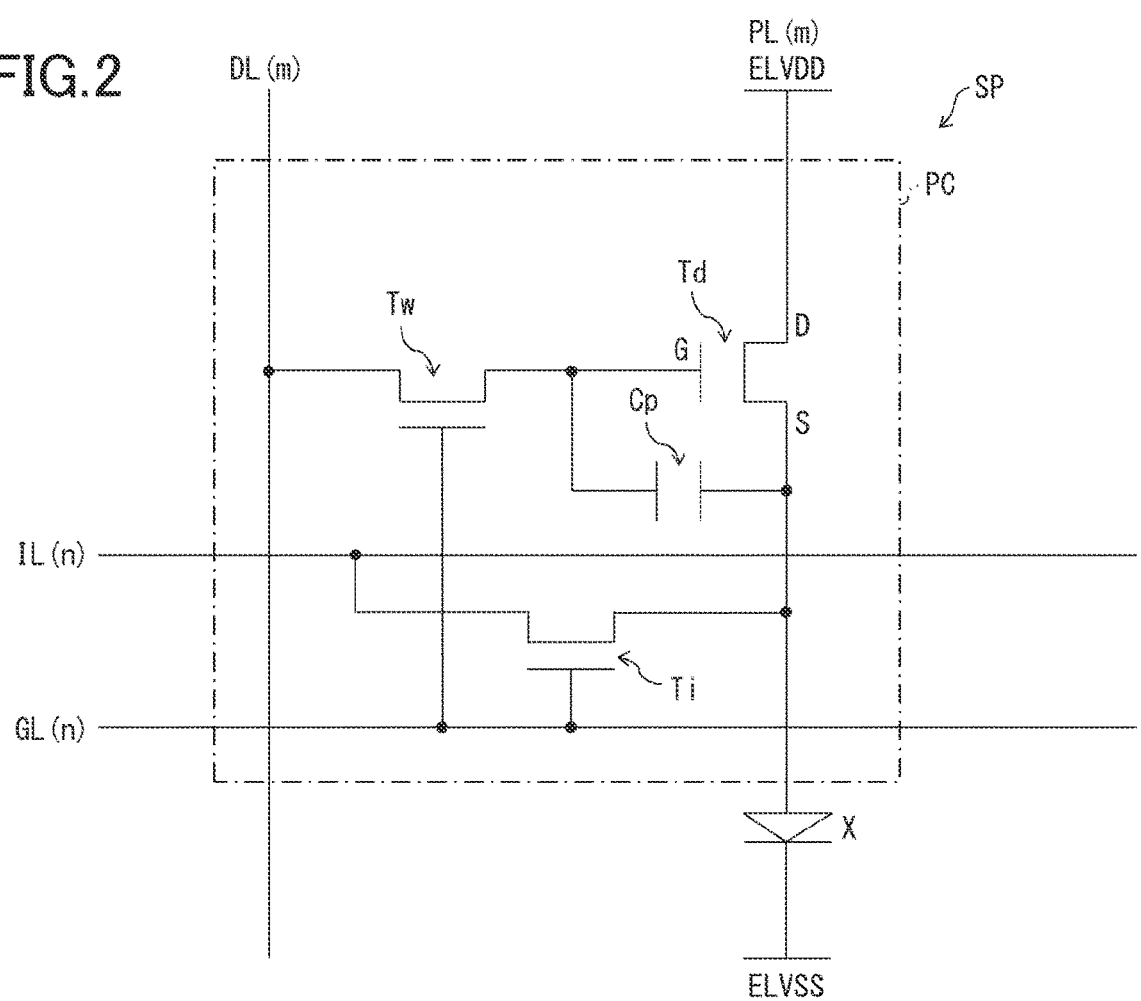
FIG. 2 is a drawing of a circuit configuration (a pixel circuit) of a sub-pixel in the first embodiment.
Figure 3:
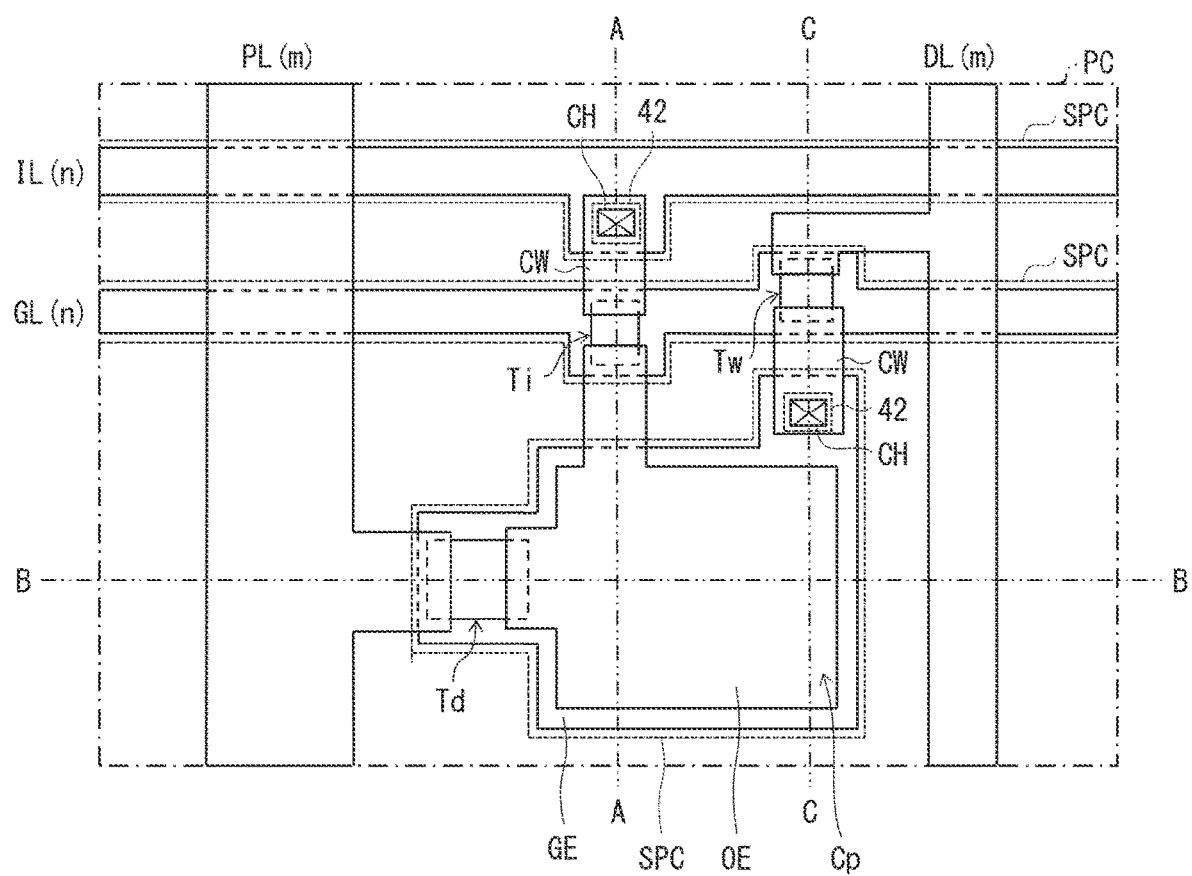
FIG. 3 is a schematic plan view illustrating the pixel circuit.

FIG. 2 is a drawing of a circuit configuration (a pixel circuit PC) of a sub-pixel SP in a first embodiment. FIG. 3 is a schematic plan view illustrating the pixel circuit PC. As illustrated in FIG. 2, the sub-pixel SP includes: the pixel circuit PC; and a light-emitting element X.

The pixel circuit PC illustrated in FIGS. 2 and 3 includes: a drive transistor Td; a write transistor Tw; an initialization transistor Ti; and a capacitor Cp. The drive transistor Td, the write transistor Tw, and the initialization transistor Ti are, for example, an N-channel transistor having an oxide semiconductor channel.

The drive transistor Td has a gate (a control terminal) connected to one end of the capacitor Cp and to the write transistor Tw. Each of the write transistor Tw and the initialization transistor Ti has a gate connected to the scanning signal line GL.

The capacitor Cp has the one end connected to a data signal line DL through the write transistor Tw. The drive transistor Td has: a first conductive electrode (a drain electrode) connected to a power source voltage line PL supplying a pixel high-voltage ELVDD; and a second conductive electrode (a source electrode) connected to another end of the capacitor Cp and an anode of a light-emitting element X. The initialization transistor Ti is connected to an initialization power source line IL and the anode of the light-emitting element X.

The light-emitting element X is formed of: the anode; an edge cover (a partition wall) covering an edge of the anode; an electroluminescence (EL) layer; and a cathode, all of which are stacked on top of another in the stated order. The edge cover is made of, for example, an applicable organic material such as polyimide or acrylic resin. The anode is exposed from an opening of the edge cover. The anode is a pixel electrode. The cathode is a common electrode in common among a plurality of sub-pixels SP. The EL layer (also referred to as an active layer, and a functional layer) is formed of, for example: a hole-injection layer; a hole-transport layer; a light-emitting layer; an electron-transport layer; and an electron-injection layer, all of which are stacked on top of another in the stated order. Using, for example, vapor deposition or ink-jet printing, the light-emitting layer is formed to overlap the opening, of the edge cover, defining a light-emitting region. The light-emitting layer may omit one or more of the hole-injection layer, the hole-transport layer, the electron-transport layer, and the electron-injection layer.

In vapor-depositing the light-emitting layer for an organic light-emitting diode (OLED), a fine metal mask (FMM) is used. The FMM is a sheet (e.g., invar) including many through holes. Organic material passing through one through hole forms a light-emitting layer (corresponding to one light-emitting element X) shaped into an island.

The light-emitting layer for a quantum-dot light-emitting diode (QLED) may be formed, for example, as follows: A solvent into which quantum dots are dispersed is applied by ink-jet printing or with a coater to form a quantum dot layer. The quantum dot layer is patterned by photolithography to form the light-emitting layer shaped into an island (corresponding one light-emitting element X).

The anode, which reflects light, is formed of, for example, a stack of indium tin oxide (ITO) and either silver (Ag) or an alloy containing Ag. The cathode can be formed of a translucent conductive material such as a MgAg alloy (an ultra-thin film), ITO, and indium zinc oxide (IZO).

If the light-emitting element X is the OLED, holes and electrons recombine together in the light-emitting layer by a current between the anode and the cathode, which forms an exciton. While the exciton transforms to the ground state, light is released. Since the cathode is translucent and the anode is light-reflective, the light emitted from the EL layer travels upward. This is how the light-emitting element layer is of a top emission type.

If the light-emitting element X is the QLED, holes and electrons recombine together in the light-emitting layer by a current between the anode and the cathode, which forms an exciton. While the exciton transforms from the conduction band level to the valence band level, light (fluorescence) is released.

The light-emitting element X may be a light-emitting element (such as an inorganic light-emitting diode) other than the OLED and the QLED. The initialization power source line IL may be the same in potential as a pixel low-voltage ELVSS. Moreover, the initialization transistor Ti may be connected to a scanning signal line GL(n−1) adjacent to a scanning signal line GL(n).

Structure of Thin-Film Transistor Layer

Figure 4:
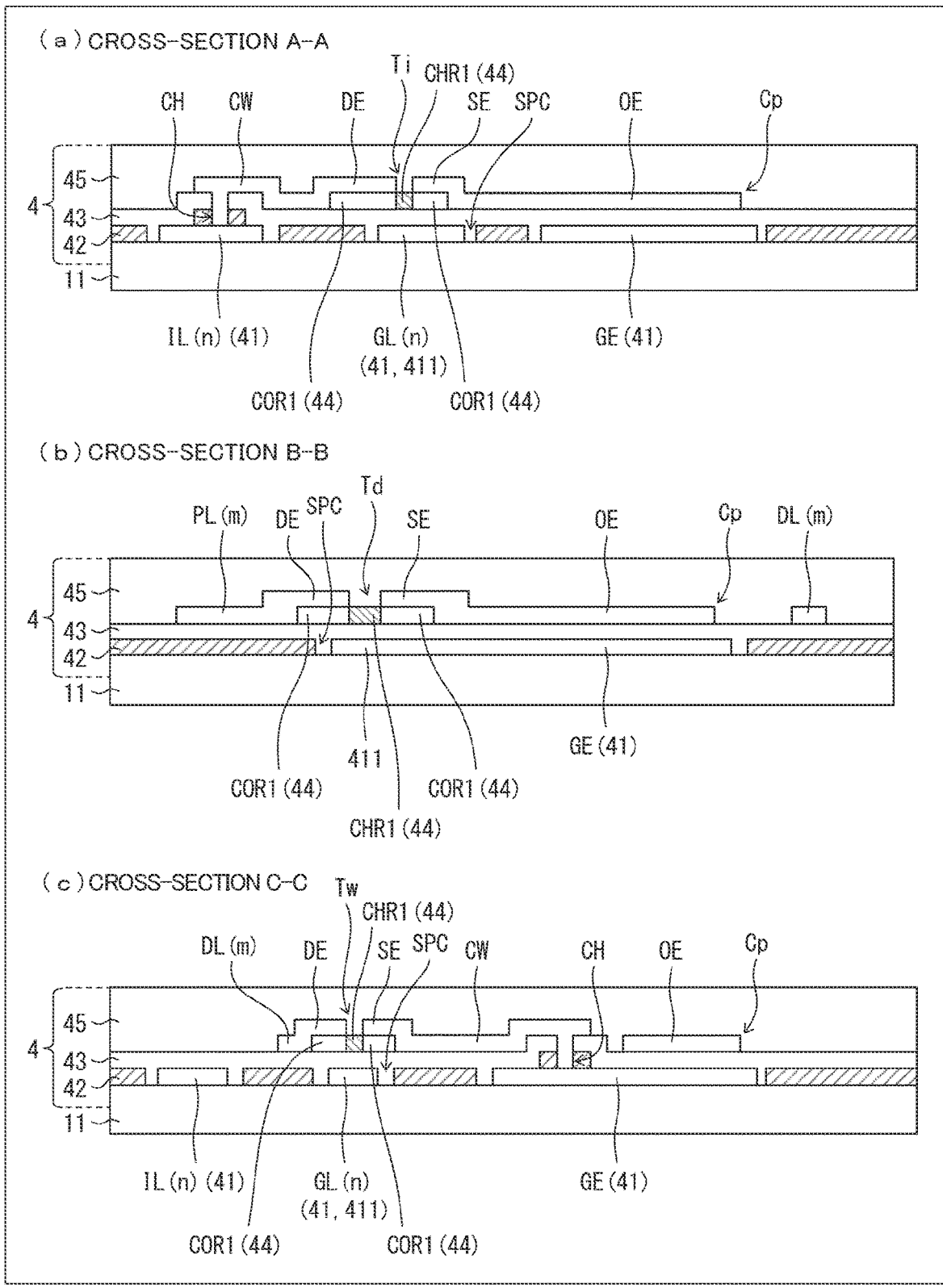
FIG. 4(a) is a cross-sectional view of a configuration of a thin-film transistor layer in the first embodiment, taken along line A-A.
FIG. 4(b) is a cross-sectional view of the configuration, taken along line B-B.
FIG. 4(c) is a cross-sectional view of the configuration, taken along line C-C.

FIG. 4 illustrates cross-sectional views taken along lines A-A, B-B, and C-C of FIG. 3. FIG. 4(a) is a cross-sectional view of a configuration of a thin-film transistor layer 4 in the first embodiment, taken along the line A-A. FIG. 4(b) is a cross-sectional view of the configuration, taken along the line B-B. FIG. 4(c) is a cross-sectional view of the configuration, taken along the line C-C.

The thin-film transistor (TFT) layer 4 in FIG. 4(a) to FIG. 4(b) includes: a first metal layer 41; a lower insulating film 42; a lower gate insulating film 43 including a metal oxide film; and an oxide semiconductor layer 44, all of which are provided on a substrate 11 in the stated order. Note that, if the lower insulating film 42 is not physically deposited on the first metal layer 41, the first metal layer 41 and the lower insulating film 42 are substantially the same in height with reference to the substrate 11.

The substrate 11 includes: a base material; and a base coat film formed on the base material. An example of the base material is glass or resin.

In this embodiment, the drive transistor Td, the write transistor Tw, and the initialization transistor Ti are a first transistor including the oxide semiconductor layer 44. Each of the drive transistor Td, the write transistor Tw, and the initialization transistor Ti includes: a first channel region CHR1 (an intrinsic semiconductor region); and a first conductor region COR1 holding the first channel region CHR1. The first channel region CHR1 and the first conductor region COR1 constitute the oxide semiconductor layer 44. Moreover, each of the drive transistor Td, the write transistor Tw, and the initialization transistor Ti includes a first gate electrode 411 across the lower gate insulating film 43 from the first channel region CHR1.

The first metal layer 41 (a gate layer) includes: the initialization power source line IL; the scanning signal line GL; and a gate electrode (a lower gate electrode) GE. The first gate electrode 411 corresponding to the drive transistor Td is a portion of the gate electrode GE. The first gate electrode 411 corresponding to each of the write transistor Tw and the initialization transistor Ti is a portion of the scanning signal line GL. In this embodiment, a second metal layer (a source layer) is formed above the lower gate insulating film 43. The second metal layer includes: a connection wire CW; the power source voltage line PL; the data signal line DL; and a counter electrode OE. These wires and electrode may be made of the same material (e.g. aluminium).

The first conductor region COR1 holding the first channel region CHR1 makes contact with a source electrode SE and a drain electrode DE and becomes conductive. Of the oxide semiconductor layer 44, a region in contact with neither the source electrode SE nor the drain electrode DE (a region under a clearance between the source electrode SE and the drain electrode DE) remains to be the intrinsic semiconductor and serves as the first channel region CHR1. The first channel region CHR1 matches the clearance between the source electrode SE and the drain electrode DE facing each other. Note that the "matching" here is to form a pattern of the channel region, using patterns of the source electrode SE and the drain electrode DE. Materials of the oxide semiconductor layer 44 will be described later.

Each of the drive transistor Td, the write transistor Tw, and the initialization transistor Ti includes the source electrode SE and the drain electrode DE overlapping the first conductor region COR1. An interlayer insulating film 45 is provided above the lower gate insulating film 43, the source electrode SE, and the drain electrode DE. The oxide semiconductor layer 44 corresponding to each of the drive transistor Td, the write transistor Tw, and the initialization transistor Ti is shaped into a single island. The interlayer insulating film 45 is formed of, for example, $SiO_2$.

As illustrated in FIG. 3 and FIG. 4(a), the initialization power source line IL (a first wire) is at least partially covered with the lower insulating film 42 and the lower gate insulating film 43, and electrically connected to the connection wire CW through a contact hole CH provided to the lower insulating film 42 and the lower gate insulating film 43. Similarly, as illustrated in FIG. 3 and FIG. 4(c), the gate electrode GE is at least partially covered with the lower insulating film 42 and the lower gate insulating film 43, and electrically connected to the connection wire CW through a contact hole CH provided to the lower insulating film 42 and the lower gate insulating film 43.

The contact hole CH is formed in the lower gate insulating film 43. After that, and before the connection wire CW is formed, the contact hole CH is formed in the lower insulating film 42. The lower gate insulating film 43 and the lower insulating film 42 have ends flushed with each other at the contact hole CH. This is because the lower gate insulating film 43 has durability under dry etching for forming the contact hole CH in the low insulating film 42.

Note that when the lower gate insulating film 43 is etched, the contact hole CH for electrical connection with the initialization power source line IL needs to be provided also to the lower insulating film 42. Here, if the gate electrode GE is inadvertently etched when the lower gate insulating film 43 is etched, the gate electrode GE to be exposed from the contact hole CH needs to be protected with the lower insulating film 42. Hence, as illustrated in FIGS. 3 and 4, the lower insulating film 42 is shaped into a frame and formed around the contact hole CH (denoted with a reference sign 42 in FIG. 3). The lower insulating film 42 protects the gate electrode GE when the lower gate insulating film 43 is etched and the contact hole CH is formed. After that, the lower insulating film 42 is etched, and the gate electrode GE is exposed from the contact hole CH. Meanwhile, if the gate electrode GE is not etched, the gate electrode GE does not have to be protected with the lower insulating film 42.

Moreover, the capacitor Cp includes: the gate electrode GE including the first gate electrode 411 corresponding to the drive transistor Td; and the counter electrode OE across the lower gate insulating film 43 from the gate electrode GE.

Materials of Oxide Semiconductor Layer 44

The oxide semiconductor contained in the oxide semiconductor layer 44 (here, simply referred to as an "oxide semiconductor layer") may be an amorphous oxide semiconductor or a crystalline oxide semiconductor having a crystalline portion. Examples of the crystalline oxide semiconductor include a polycrystalline oxide semiconductor, a microcrystalline oxide semiconductor, and a crystalline oxide semiconductor whose c-axis is oriented substantially orthogonally to a plane of a layer.

The oxide semiconductor layer 44 may be a multilayer including two or more layers. If the oxide semiconductor layer 44 is a multilayer, the oxide semiconductor layer 44 may contain a non-crystalline oxide semiconductor layer and a crystalline oxide semiconductor layer. Alternatively, the oxide semiconductor layer 44 may contain a plurality of crystalline oxide semiconductor layers having different crystal structures. Still alternatively, the oxide semiconductor layer 44 may contain a plurality of non-crystalline oxide semiconductor layers.

Features of an oxide semiconductor layer including the non-crystalline oxide semiconductor and the crystalline oxide semiconductors formed of the above materials, in the above structures, with the above deposition techniques, and in the above multilayer structures are described in, for example, Japanese Unexamined Patent Application Publication No. 2014-007399. The whole content disclosed in Japanese Unexamined Patent Application Publication No. 2014-007399 is incorporated by reference into this Description.

The oxide semiconductor layer may contain at least one metallic element from among, for example, In, Ga, and Zn. In this embodiment, the oxide semiconductor layer contains, for example, an In—Ga—Zn—O-based semiconductor (e.g. indium gallium zinc oxide). Here, the In—Ga—Zn—O-based semiconductor is a ternary oxide of In (indium), Ga (gallium), and Zn (zinc). A ratio of In to Ga to Zn is not limited to a particular one. Examples of the ratio include In:Ga:Zn=2:2:1, In:Ga:Zn=1:1:1, and In:Ga:Zn=1:1:2. Such an oxide semiconductor layer can be formed of an oxide semiconductor film containing an In—Ga—Zn—O-based semiconductor.

The In—Ga—Zn—O-based semiconductor may be an amorphous semiconductor or a crystalline semiconductor.

Preferably, the crystalline In—Ga—Zn—O-based semiconductor has the c-axis oriented substantially orthogonally to a plane of a layer.

Note that a crystal structure of the crystalline In—Ga—Zn—O-based semiconductor is disclosed in above Japanese Unexamined Patent Application Publication No. 2014-007399, and Japanese Unexamined Patent Application Publication Nos. 2012-134475 and 2014-209727. The whole contents disclosed in Japanese Unexamined Patent Application Publication Nos. 2012-134475 and 2014-209727 are incorporated by reference into this Description. A TFT including an In—Ga—Zn—O semiconductor layer is high in mobility (20 times as high as, or higher than, the mobility of an a-Si TFT), and low in current leakage (lower than one hundredth of the current leakage of an a-Si TFT). Hence, the TFT is preferably used as a drive TFT (e.g. a TFT included in a drive circuit provided, around the display region including a plurality of pixels, on the same substrate as that of the display region), and as a pixel TFT (a TFT provided to a pixel).

The oxide semiconductor layer may contain another oxide semiconductor instead of the In—Ga—Zn—O-based semiconductor. For example, the oxide semiconductor layer may contain an In—Sn—Zn—O-based semiconductor (e.g. $In_2O_3$—$SnO_2$—$ZnO$; InSnZnO). The In—Sn—Zn—O-based semiconductor is a ternary oxide of In (indium), Sn (tin), and Zn (zinc). Alternatively, the oxide semiconductor layer may contain such a substance as an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, $InGaO_3(ZnO)_5$, magnesium zinc oxide ($Mg_xZn_{1-x}O$), and cadmium zinc oxide ($Cd_xZn_{1-x}O$). The Zn—O-based semiconductor may contain non-crystalline (amorphous) ZnO, polycrystalline ZnO, or microcrystalline ZnO which is a mixture of non-crystalline ZnO and polycrystalline ZnO. Added to the Zn—O-based semiconductor may be one, or two or more, of impurity elements from among elements in group 1, group 13, group 14, group 15, or group 17 are added, or may be no impurity elements.

Details of Low Insulating Film

As illustrated in FIGS. 3 and 4, a clearance SPC is formed between the lower insulating film 42 and the first gate electrode 411. The clearance SPC is filled with the lower gate insulating film 43. In other words, the lower insulating film 42 and the first gate electrode 411 do not overlap each other. The lower insulating film 42 may be made of spin-on-glass (SOG).

That is, the thin-film transistor layer 4 in the first embodiment; that is, a bottom-gate oxide semiconductor TFT, has features below. The first gate electrode 411 and the lower insulating film 42 holding the first gate electrode 411 are formed in the same layer with the clearance SPC provided therebetween. Between (i) the first gate electrode 411 and the lower insulating film 42 and (ii) the oxide semiconductor layer 44, the lower gate insulating film 43 is provided. The lower gate insulating film 43, containing a metal oxide film, is applicable and larger in permittivity than the gate insulating film.

In the first embodiment, the lower insulating film 42 is formed basically not in, or around, the lower insulating film 42.

An applicable material to be a base of the lower insulating film 43 (hereinafter simply referred to as an applicable material) is applied to the various wires and electrode formed of the first metal layer 41. In order to provide the lower gate insulating film 43 with sufficient film thickness, the lower insulating film 42 is disposed in a region in which no various wires or electrodes are arranged. The lower gate insulating film 43 is formed of an applicable material; namely, a high-k material. An example of the high-k material includes a composite oxide containing at least any one of lanthanum (La), calcium (Ca), zirconium (Zr), and magnesium (Mg). More specifically, the lower gate insulating film 43, made of high-k, is a metal oxide film mainly made of, for example: one, or two or more, of elements selected from among alkaline-earth metals (Be, Mg, Ca, Sr, Ba, and Ra); and one, or two or more, of elements selected from among Ga, Sc, Y, and lanthanide elements (La, Pr, Nd, Pm, Sm, Eu, Gd, Tb, Dy, Ho, Er, Tm, Yb, and Lu (except Ce)).

The metal oxide; that is, a main ingredient of the lower gate insulating film 43, is higher in relative permittivity than a nonmetallic inorganic compound (e.g. $SiN_x$, $SiO_x$) included in the lower insulating film 42. More specifically, the high-k material to be used for the lower gate insulating film 43 has a permittivity ranging from, for example, 9 to 12. $SiO_2$ and $SiN_x$ to be used for the lower insulating film 42 respectively have permittivities of approximately 4 and 7. In other words, the permittivity of the lower insulating film 42 is lower than the permittivity of the lower gate insulating film 43.

In a case where the viscosity of the applicable material is maintained, a possible technique to provide the lower gate insulating film 43 with great film thickness is to (1) decrease speed of the spin coater. In a case where the speed of the spin coater is maintained, another possible technique to provide the lower gate insulating film 43 with great film thickness is to (2) increase the viscosity of the applicable material. If the viscosity of the applicable material changes, the physical properties of the applicable material might change. Hence, the technique (1) is usually adopted. Described here is an example in which the spin coater is used to apply the applicable material. Alternatively, a slit coater may be used instead of the spin coater to apply the applicable material. The lower gate insulating film 43 concentrates in a position not on the various wires or electrodes, and forms thin on the various wires and electrode. Hence, the lower gate insulating film 42, serving as a so-called bank, is provided in a position not on the various wires or electrodes. Thanks to such a feature, the amount of the applicable material to be used is reduced while the lower gate insulating film 43 is provided with a portion having sufficient film thickness on the various wires and electrode, thereby making it possible to reduce material costs. If the lower gate insulating film 43 is formed to have small film thickness when the lower insulating film 42 serving as a bank is not formed, the lower gate insulating film 43 has excessively small film thickness on ends of the various wires and electrode. Consequently, the breakdown voltage of the display device 2 might decrease.

Thanks to the above feature, the lower insulating film 42 is formed to serve as a bank, making it possible to limit the amount of the applicable material leaving the first gate electrode 411. Hence, much of the applicable material can stay on the first gate electrode 411.

Consequently, thanks to the above feature, the lower gate insulating film 43 can have a portion with sufficient film thickness (the film thickness required for manufacturing the display device 2) on the first gate electrode 411. That is, the lower gate insulating film 43 can be kept from decreasing in film thickness on the first gate electrode 411, thereby contributing to reducing the risk of decrease in breakdown voltage of the display device 2. Moreover, the amount of the applicable material to be used is reduced while the lower gate insulating film 43 is provided with sufficient film thickness, contributing to reducing material costs.

First Modification

FIG. 5(a) is a cross-sectional view of a configuration of a first modification of the thin-film transistor layer 4 in the first embodiment, taken along line A-A. FIG. 5(b) is a cross-sectional view of the configuration of the first modification, taken along line B-B. FIG. 4(c) is a cross-sectional view of the configuration of the first modification, taken along line C-C.

Figure 5:
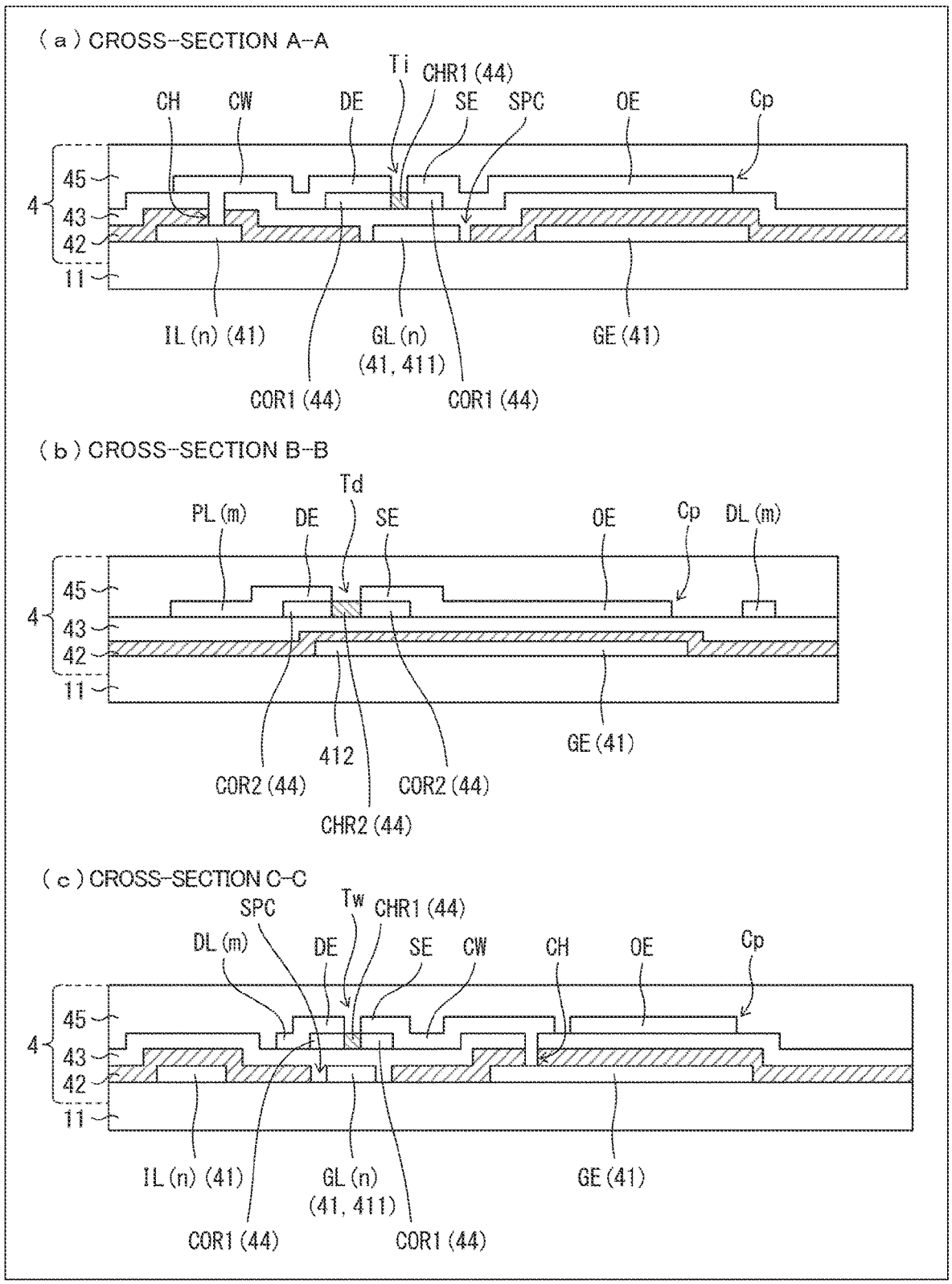
FIG. 5(a) is a cross-sectional view of a configuration of a first modification of the thin-film transistor layer in the first embodiment, taken along line A-A.
FIG. 5(b) is a cross-sectional view of the configuration of the first modification, taken along line B-B.
FIG. 5(c) is a cross-sectional view of the configuration of the first modification, taken along line C-C.

As illustrated in FIG. 5, the lower insulating film 42 may be provided further between the gate electrode GE and the counter electrode OE included in the capacitor Cp.

In this modification, the drive transistor Td is a second transistor provided on the substrate 11 and including the oxide semiconductor layer 44. The drive transistor Td illustrated in FIG. 5 includes: a second channel region CHR2 (an intrinsic semiconductor region); and a second conductor region COR2 holding the second channel region CHR2. The second channel region CHR2 and the second conductor region COR2 are included in the oxide semiconductor layer 44. Moreover, the drive transistor Td includes a second gate electrode 412 across the lower insulating film 42 and the lower gate insulating film 43 from the second channel region CHR2. The drive transistor Td, which corresponds to the second gate electrode 412, is a portion of the gate electrode GE.

In this example, the lower insulating film 42 is basically formed not at, or around, the scanning signal line GL.

Such a feature can reduce parasitic capacitance generated in the drive transistor Td, making it possible to increase an s-value and facilitate grayscale control (grayscale representation).

Note that, in this modification, the drive transistor Td is, but not limited to, the second transistor. Either the write transistor Tw or the initialization transistor Ti may be the second transistor.

For other switching transistors (not-shown), the lower gate insulating film 43 may be used as a gate insulating film. Such a feature makes it possible to improve the switching performance.

Furthermore, the capacitor Cp also includes the lower insulating film 42 and the lower gate insulating film 43 between the gate electrode GE and the counter electrode OE. As illustrated in FIG. 5(c), such a feature makes it possible to form the counter electrode OE in a large size in order to enlarge the overlapping area between the gate electrode GE and the counter electrode OE. Consequently, the feature makes it possible to reduce a range of variation in capacitance of the capacitor Cp caused by variation of the finished capacitor Cp.

Second Modification

Figure 6:
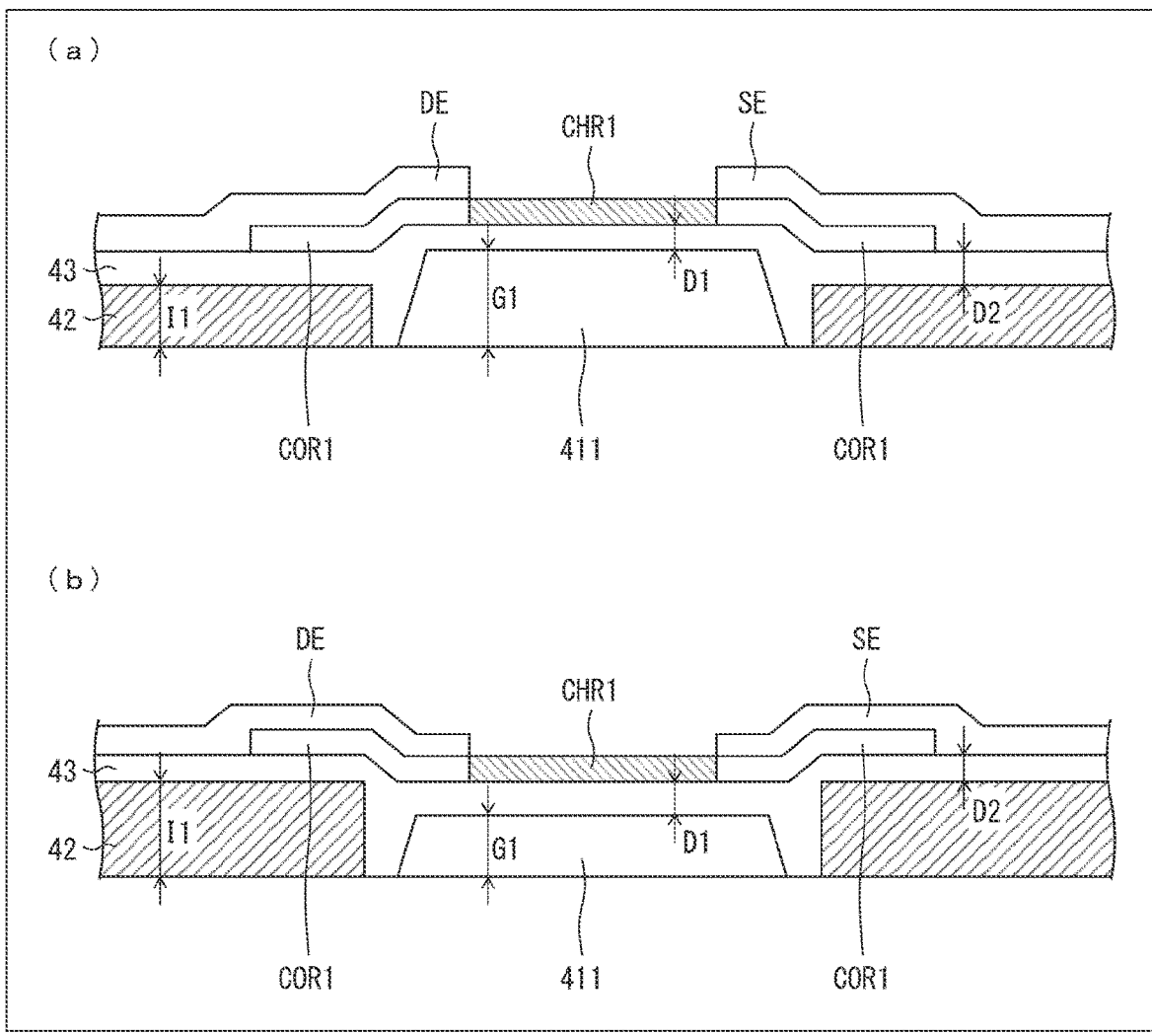
FIG. 6(a) is a cross-sectional view of a configuration of a second modification of the thin-film transistor layer in the first embodiment.
FIG. 6(b) is a cross-sectional view of another configuration of the second modification of the thin-film transistor layer in the first embodiment.

FIG. 6(a) is a cross-sectional view of a configuration of a second modification of the thin-film transistor layer 4 in the first embodiment. FIG. 6(b) is a cross-sectional view of another configuration of the second modification of the thin-film transistor layer 4 in the second embodiment. For the sake of brevity, FIG. 6(a) and FIG. 6(b) illustrate only the first gate electrode 411 and members around the first gate electrode 411 (except the interlayer insulating film 45) in FIG. 4(c).

As illustrated in FIG. 6(a), a film thickness G1 of the first gate electrode 411 may be greater than a film thickness I1 of the lower insulating film 42. A film thickness D1 of the lower gate insulating film 43 on the first gate electrode 411 may be smaller than a film thickness D2 of the lower gate insulating film 43 on the lower insulating film 42. Such features make it possible to reduce the film thickness of the lower gate insulating film 43 on the first gate electrode 411 and across from the first channel region CHR1. Hence, when any one of the drive transistor Td, the write transistor Tw, and the initialization transistor Ti corresponding to the first gate electrode 411 turns ON, a value of the current flowing in the transistor can be increased (highly ionized).

As illustrated in FIG. 6(b), the film thickness G1 of the first gate electrode 411 may be smaller than the film thickness I1 of the lower insulating film 42. The film thickness D1 of the lower gate insulating film 43 on the first gate electrode 411 may be greater than the film thickness D2 of the lower gate insulating film 43 on the lower insulating film 42. Such a feature makes it possible to reduce parasitic capacitance between the source electrode SE and the drain electrode DE.

Note that the film thickness G1 of the first gate electrode 411 and the film thickness I1 of the lower insulating film 42 may substantially be the same, and the film thickness D1 of the lower gate insulating film 43 on the first gate electrode 411 and the film thickness D2 of the lower gate insulating film 43 on the lower insulating film 42 may substantially be the same.

Example of Forming Thin-Film Transistor Layer

Figure 7:
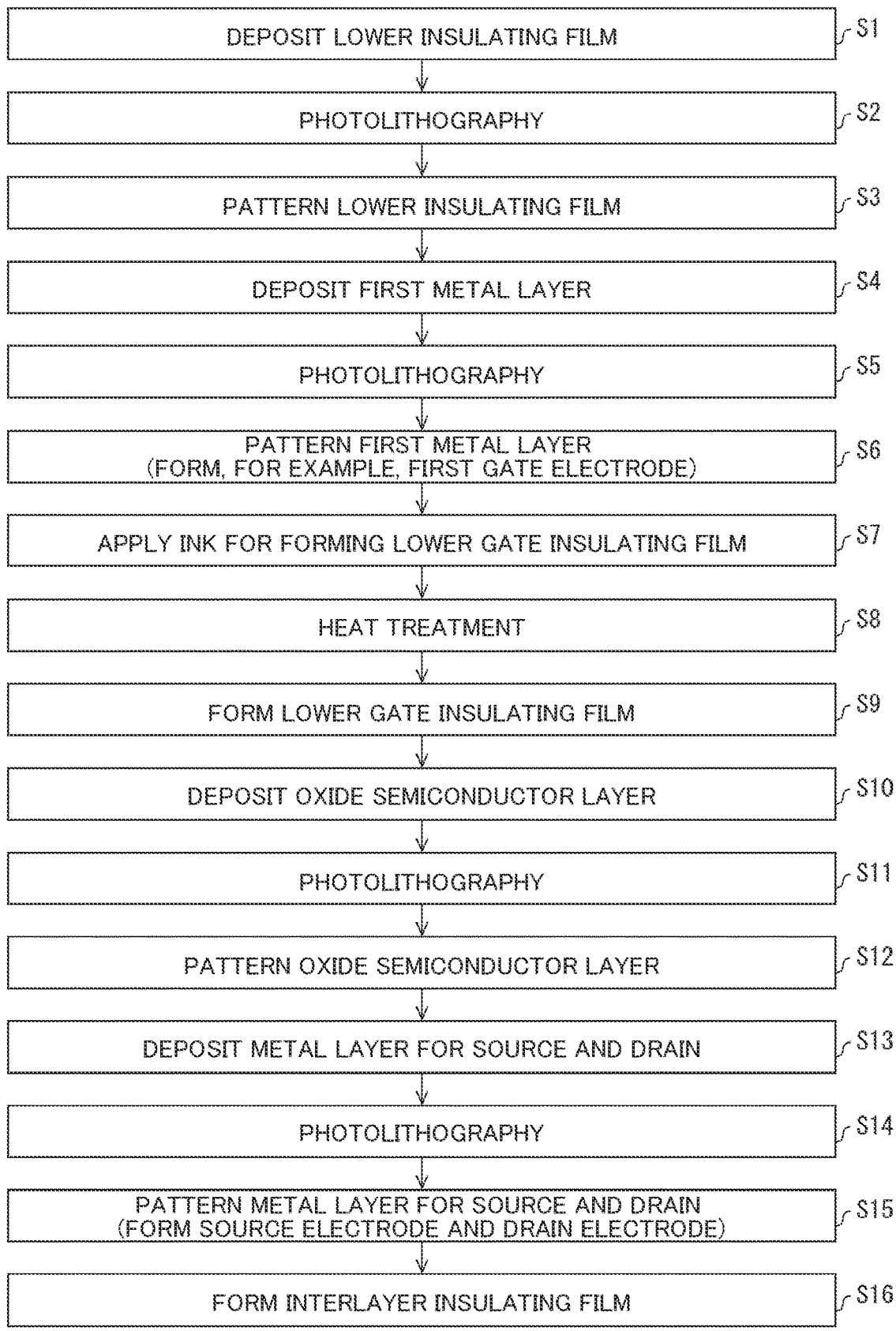
FIG. 7 is a flowchart showing steps to form the thin-film transistor layer in the first embodiment.

FIG. 7 is a flowchart showing steps to form the thin-film transistor layer 4 in the first embodiment.

First, at Step S1, the lower insulating film 42 is deposited on the substrate 11. At Step S2, the lower insulating film 42 is processed by photolithography. At Step S3, the lower insulating film 42 is etched to have a desired pattern.

Figure 8:
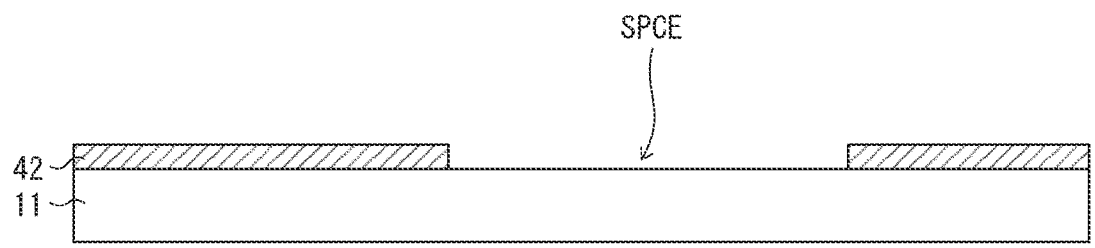
FIG. 8 is a cross-sectional view schematically illustrating a moment when Step S3 ends.

FIG. 8 is a cross-sectional view schematically illustrating a moment when Step S3 ends. For the sake of brevity, FIG. 8 and FIGS. 9 to 13 to be shown later illustrate only a portion corresponding to the write transistor Tw in FIG. 4(c) and surroundings of the portion. The lower insulating film 42 is provided with a clearance SPCE for forming the first gate electrode 411 and the clearance SPC. The lower insulating film 42 has a film thickness ranging from, for example, 100 to 300 nm.

Examples of a base material contained in the substrate 11 include a glass substrate, a silicone substrate, and a heat-resistant plastic substrate (a resin substrate). Examples of a material of the plastic substrate (the resin substrate) include polyethylene terephthalate (PET), polyethylene naphthalate (PEN), polyethersulfone (PES), acrylic resin, and polyimide.

At Step S4, the first metal layer 41 is deposited. At Step S5, the first metal layer 41 is processed by photolithography. At Step S6, the metal layer 41 is etched to have a desired pattern. In other words, the metal layer 41 is etched, and such components as the first gate electrode 411 are formed.

The first metal layer 41 may be appropriately made of such materials as: metals including aluminum (Al), tungsten (W), molybdenum (Mo), tantalum (Ta), chromium (Cr), titanium (Ti), and copper (Cu); an alloy of the metals; or a metal nitride of these metals. Moreover, the first metal layer 41 may be a multilayer stack formed of these materials.

Figure 9:
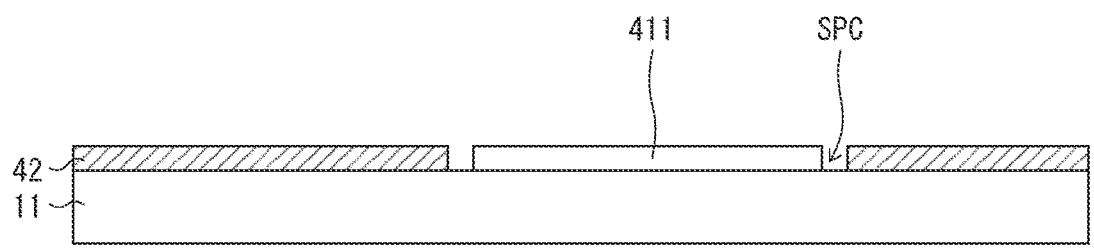
FIG. 9 is a cross-sectional view schematically illustrating a moment when Step S6 ends.

FIG. 9 is a cross-sectional view schematically illustrating a moment when Step S6 ends. The first gate electrode 411 and the clearance SPC are formed in the clearance SPCE. The first gate electrode 411 has a film thickness ranging from, for example, 100 to 300 nm. The clearance SPC has a width of, for example, 1 μm.

At Step S7, an ink (an applicable material) for forming the lower gate insulating film 43 is applied to the first metal layer 41 and the lower insulating film 42. This ink is, for example, a mixture of magnesium 2-ethylhexanoate toluene solution and lanthanum 2-ethylhexanoate toluene solution. Examples of a technique to apply the ink include spin coating, ink-jet printing, slit coating, printing with a nozzle, rotogravure, and microcontact printing.

At Step 8, the applied ink is treated with heat and converted into an oxide insulating film. At Step 9, the lower gate insulating film 43 is formed to have a thickness ranging, for example, from 50 to 400 nm.

Figure 10:
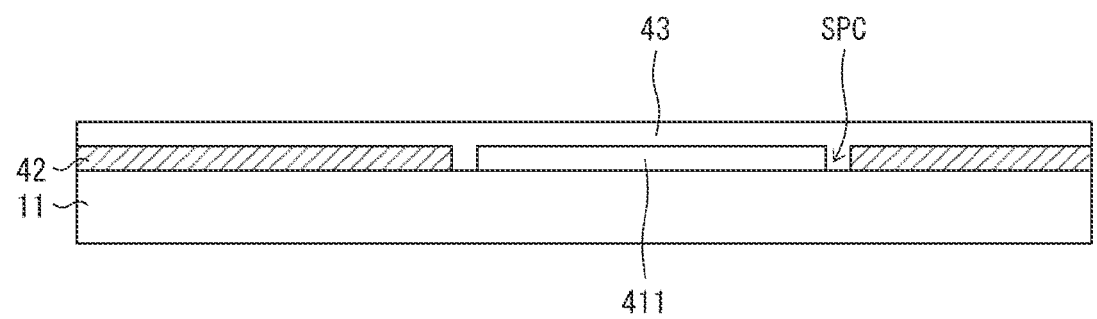
FIG. 10 is a cross-sectional view schematically illustrating a moment when Step S9 ends.

FIG. 10 is a cross-sectional view schematically illustrating a moment when Step S9 ends. The lower gate insulating film 43 is provided to cover the first gate electrode 411 and the lower insulating film 42. Moreover, the clearance SPC is filled with the lower gate insulating film 43.

At Step S10, the oxide semiconductor layer 44 is deposited. At Step S11, the oxide semiconductor layer 44 is processed by photolithography. At Step S12, the oxide semiconductor layer 44 is etched to have a desired pattern. After that, the lower gate insulating film 43 is processed by photolithography to have a desired pattern. After that, the lower insulating film 42 is etched to have a contact hole CH. Note that the step for etching the lower insulating film 42 is unnecessary if the gate electrode GE is resistant to the etchant for the lower gate insulating film 43.

Figure 11:
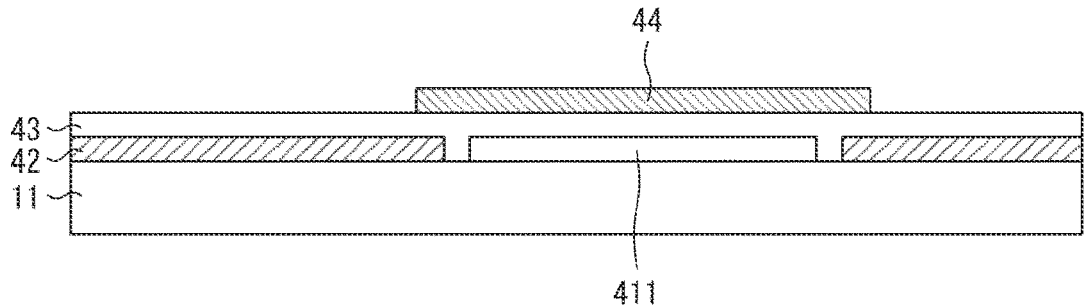
FIG. 11 is a cross-sectional view schematically illustrating a moment when Step S12 ends.

FIG. 11 is a cross-sectional view schematically illustrating a moment when Step S12 ends. The oxide semiconductor layer 44 is formed on the first gate electrode 411.

At Step S13, a metal layer is deposited for the source electrode SE and the drain electrode DE. At Step S14, the metal layer is processed by photolithography. At Step 15, the metal layer is etched to have a desired pattern, so that the source electrode SE and the drain electrode DE are formed.

The metal layer may be appropriately made of such materials as aluminum (Al), molybdenum (Mo), tantalum (Ta), chromium (Cr), titanium (Ti), and gold (Au). Moreover, the metal layer may be a multilayer stack formed of these materials.

When the source electrode SE and the drain electrode DE are formed, a region of the oxide semiconductor layer 44 comes into contact with the source electrode SE and the drain electrode DE, and the region of contact becomes conductive. Hence, the first conductor region COR1 is formed. Meanwhile, of the oxide semiconductor layer 44, a region of non-contact with the source electrode SE and the drain electrode DE serves as the first channel region CHR1.

Figure 12:
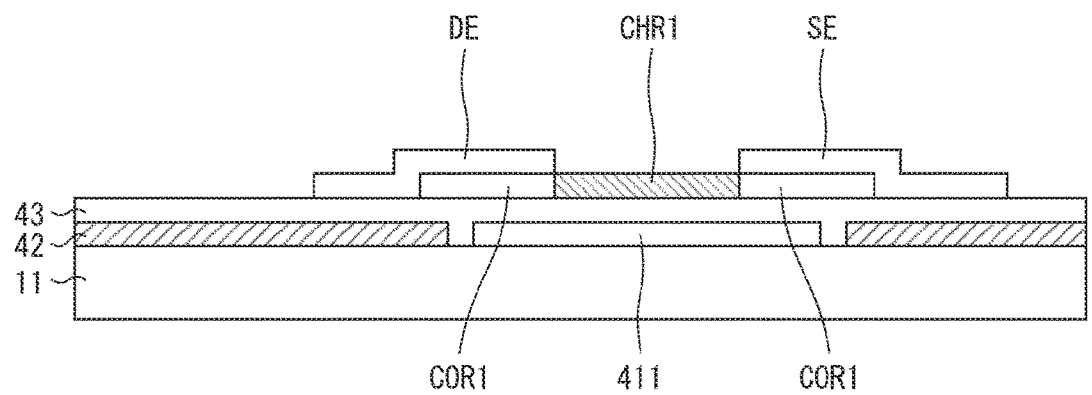
FIG. 12 is a cross-sectional view schematically illustrating a moment when Step S15 ends.

FIG. 12 is a cross-sectional view schematically illustrating a moment when Step S15 ends. The oxide semiconductor layer 44 includes: the first channel region CHR1; and the first conductor region COR1 provided to hold the first channel region CHR1. The source electrode SE and the drain electrode DE are provided on the first conductor region COR1.

At Step S16, the interlayer insulating film 45 is formed to cover all the cross-section formed in Step S15. The interlayer insulating film 45 may be formed of, for example, a silicon oxide ($SiO_2$) film, a silicon nitride ($SiN_x$) film, or a multilayer film including these films.

Figure 13:
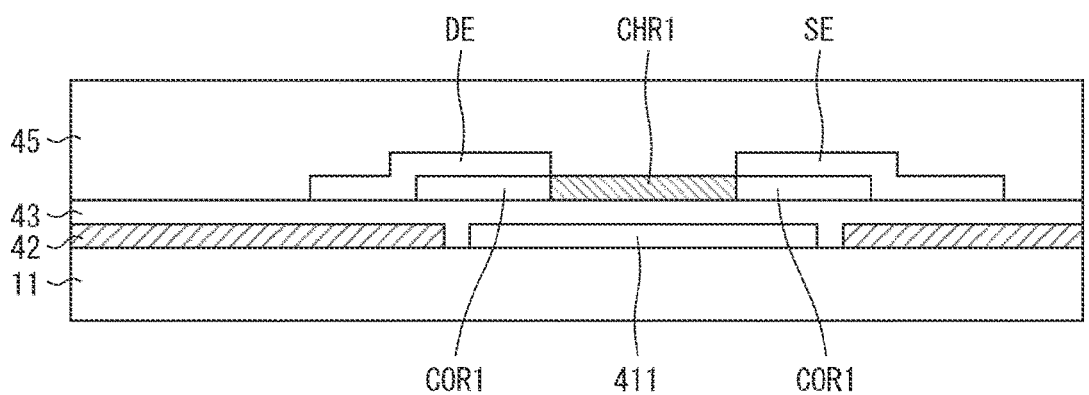
FIG. 13 is a cross-sectional view schematically illustrating a moment when Step S16 ends.

FIG. 13 is a cross-sectional view schematically illustrating a moment when Step S16 ends. The interlayer insulating film 45 covers all the cross-section (see FIG. 12) formed in Step S15.

Second Embodiment

Described below is another embodiment of the disclosure. Note that, as a matter of convenience, identical reference signs are used to denote functionally identical components between this embodiment and the above embodiment. Such components will not be repeatedly elaborated upon.

Figure 14:
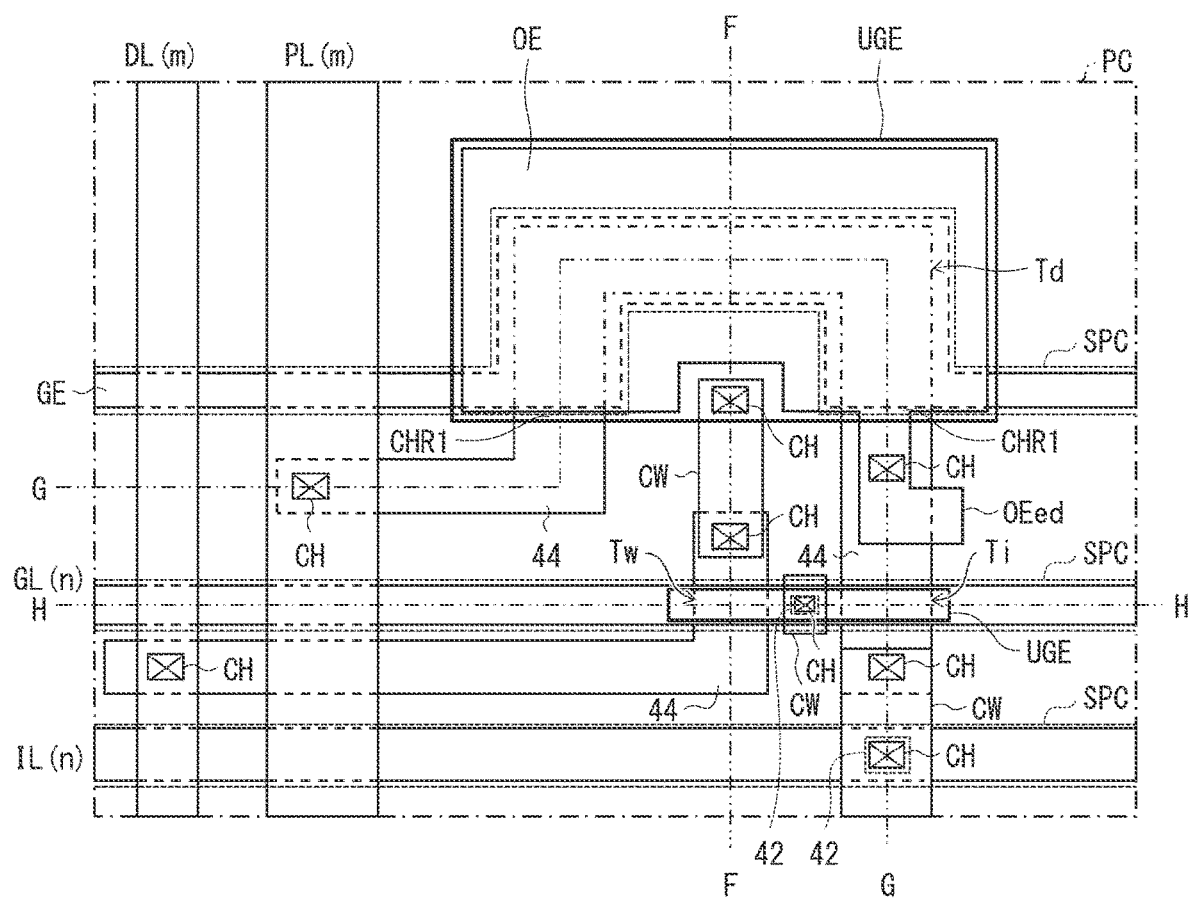
FIG. 14 is a schematic plan view illustrating a pixel circuit in a second embodiment.

FIG. 14 is a schematic plan view illustrating a pixel circuit PC in a second embodiment. FIG. 15(a) is a cross-sectional view of a configuration of a thin-film transistor layer in the second embodiment, taken along line F-F. FIG. 15(b) is a cross-sectional view of the configuration, taken along line G-G. FIG. 15(c) is a cross-sectional view of the configuration, taken along line H-H. Note that the circuit diagram is the same as that in the first embodiment (FIG. 2).

Figure 15:
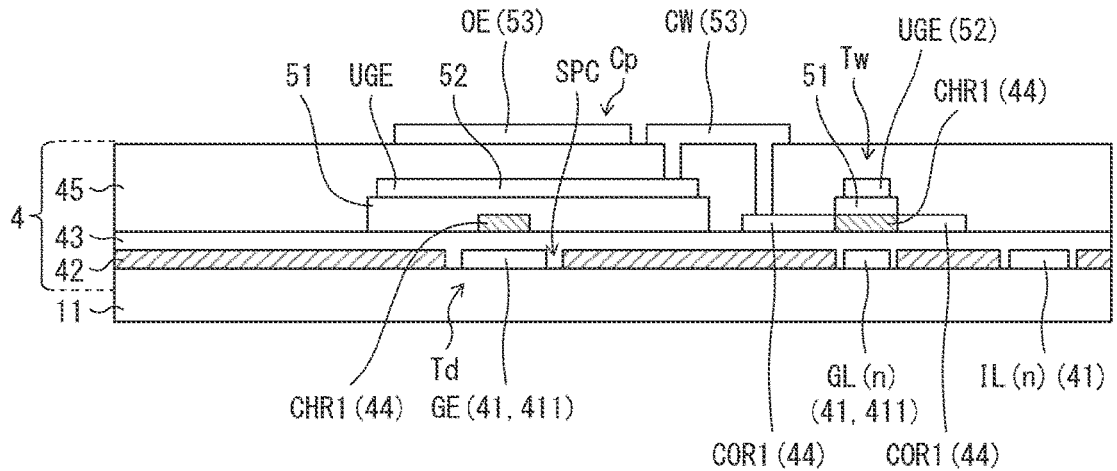
FIG. 15(a) is a cross-sectional view of a configuration of a thin-film transistor layer in the second embodiment, taken along line F-F.
FIG. 15(b) is a cross-sectional view of the configuration, taken along line G-G.
FIG. 15(c) is a cross-sectional view of the configuration, taken along line H-H.
Figure 15:
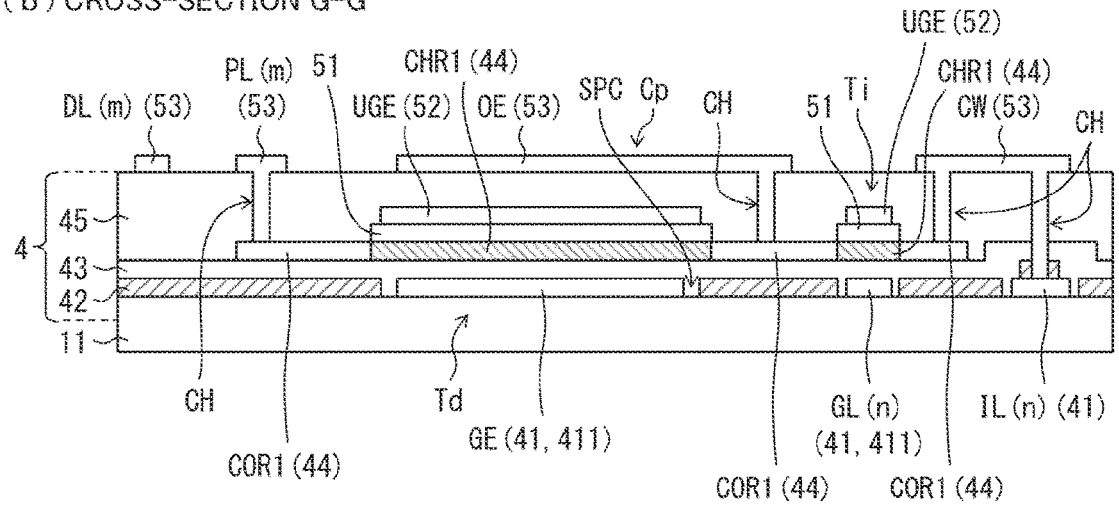
Figure 15:
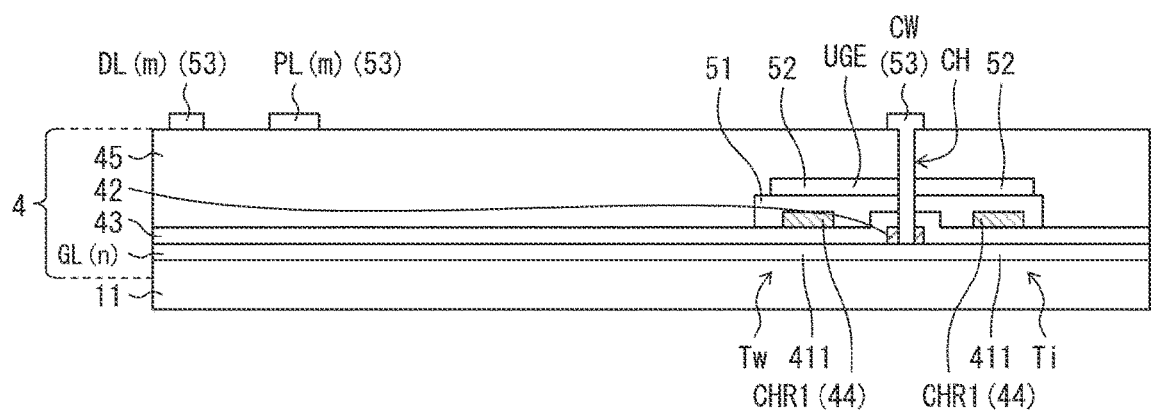

As illustrated in FIGS. 14 and 15, the thin-film transistor layer 4 in this embodiment includes: the first metal layer 41; the lower insulating film 42; the lower gate insulating film 43; and the oxide semiconductor layer 44, all of which are provided on the substrate 11 in the stated order as seen in the first embodiment. In this embodiment, the thin-film transistor 4 further includes: an upper gate insulating film 51; an upper gate electrode UGE; the interlayer insulating film 45; and an upper metal layer 53, all of which are provided above the oxide semiconductor layer 44 in the stated order. The upper gate insulating film 51 is made of, for example, $SiO_2$.

That is, the thin-film transistor layer 4 in this embodiment may also be referred to as a double-gate oxide semiconductor TFT including the gate electrode GE, and additionally including the upper gate electrode UGE. Note that, the thin-film transistor layer 4 in the first embodiment may also be referred to as a bottom-gate oxide semiconductor TFT including the gate electrode GE (the lower gate electrode) on the substrate 11.

As seen in the first embodiment, in the thin-film transistor layer 4 of this embodiment, the drive transistor Td, the write transistor Tw, and the initialization transistor Ti are the first transistor including the oxide semiconductor layer 44. That is, each of the drive transistor Td, the write transistor Tw, and the initialization transistor Ti includes: the first channel region CHR1; the first conductor region COR1; and the first gate electrode 411 across the lower gate insulating film 43 from the first channel region CHR1.

Meanwhile, in this embodiment, each of the drive transistor Td, the write transistor Tw, and the initialization transistor Ti includes a third gate electrode 52 included in the upper gate electrode UGE, and provided across the upper gate insulating film 51 from the first channel region CHR1. The first conductor region COR1 matches the third gate electrode 52. Note that the "matching" here is to form a pattern of the first conductor region COR1, using a pattern of the third gate electrode 52. That is, the oxide semiconductor layer 44 not overlapped with the upper gate electrode UGE forms the first conductor region COR1. Note that even if the upper gate insulating film 51 is patterned in a monolithic form, the upper gate insulating film 51 may match the upper gate electrode UGE, and the first conductor region COR1 may be formed. Note that even if the upper gate insulating film 51 is not patterned in a monolithic form and the first conductor region COR1 matches the upper gate insulating film 51, the upper gate insulating film 51 eventually matches the upper gate electrode UGE.

Similar to the first embodiment, in this embodiment, the gate electrode GE, the scanning signal line GL, and the initialization power source line IL form the first metal layer 41. Meanwhile, in this embodiment, the upper gate electrode UGE above the upper gate insulating film 51 forms a second metal layer. Moreover, the connection wire CW, the power source voltage line PL, the data signal line DL, and the counter electrode OE above the interlayer insulating film 45 form the upper metal layer 53 (a third metal layer). These wires and electrode may be made of the same material (e.g. aluminum). The counter electrode OE has an extending region whose end OEed (see FIG. 14) is electrically connected to an anode of the light-emitting element X.

Furthermore, in this embodiment, the gate electrode GE is a wire in common among the pixel circuits PC included in the sub-pixels SP. That is, the gate electrode GE is electrically connected to the gate electrode GE of another pixel circuit PC adjacent to the pixel circuit PC. A potential of the gate electrode GE is constant (e.g. grounded). Such features make it possible to reduce variation in voltage threshold, possibly occurring between the drive transistors Td of the sub-pixels SP, for switching between ON and OFF of the drive transistors Td.

Note that when the gate electrode GE is not grounded, the gate electrode GE and the upper gate electrode UGE may be electrically connected to each other. Here, the third gate electrode 52, which corresponds to the drive transistor Td, is electrically connected to another third gate electrode 52, which corresponds to the drive transistor Td of an adjacent pixel circuit PC. Such features also make it possible to reduce variation in voltage threshold.

If the gate electrode GE or the scanning signal line GL and the upper gate electrode UGE are electrically connected together, the third gate electrode 52 is to be electrically connected to the first gate electrode 411. When the third gate electrode 52 has the same potential as that of the first gate electrode 411, the switching characteristics of the transistors can improve. In view of improving the switching characteristics, the first transistor may be the write transistor Tw.

As illustrated in FIG. 14 and FIG. 15(b), the initialization power source line IL (the first wire) is at least partially covered with the lower insulating film 42 and the lower gate insulating film 43, and electrically connected to the connection wire CW through a contact hole CH provided to the lower gate insulating film 43 and the interlayer insulating film 45. As illustrated in the drawings, other contact holes CH are provided in various positions to electrically connect the wires or electrodes in each of the layers. In FIG. 14, the reference sign 42 denotes the lower insulating film 42 shaped into a frame and formed around a contact hole CH.

If $SiO_2$ is used as the lower insulating film 42 and the upper gate insulating film 51, the contact hole CH illustrated in FIG. 15(b) and FIG. 15(c) and formed in the lower insulating film 42 may be formed simultaneously as the upper gate insulating film 51 is etched.

Details of Lower Insulating Film

As illustrated in FIGS. 14 and 15, the clearance SPC is formed between the lower insulating film 42 and the first gate electrode 411. The clearance SPC is filled with the lower gate insulating film 43. In other words, the lower insulating film 42 and the first gate electrode 411 do not overlap each other.

Note that the second transistor may be provided as seen in the first modification of the first embodiment. For example, the drive transistor Td may be the second transistor.

Modification

FIG. 16(a) is a schematic plan view partially illustrating a configuration of a modification of the thin-film transistor layer 4 in the second embodiment. FIG. 16(b) is a cross-sectional view of FIG. 16(a), taken along line D-D.

Figure 16:
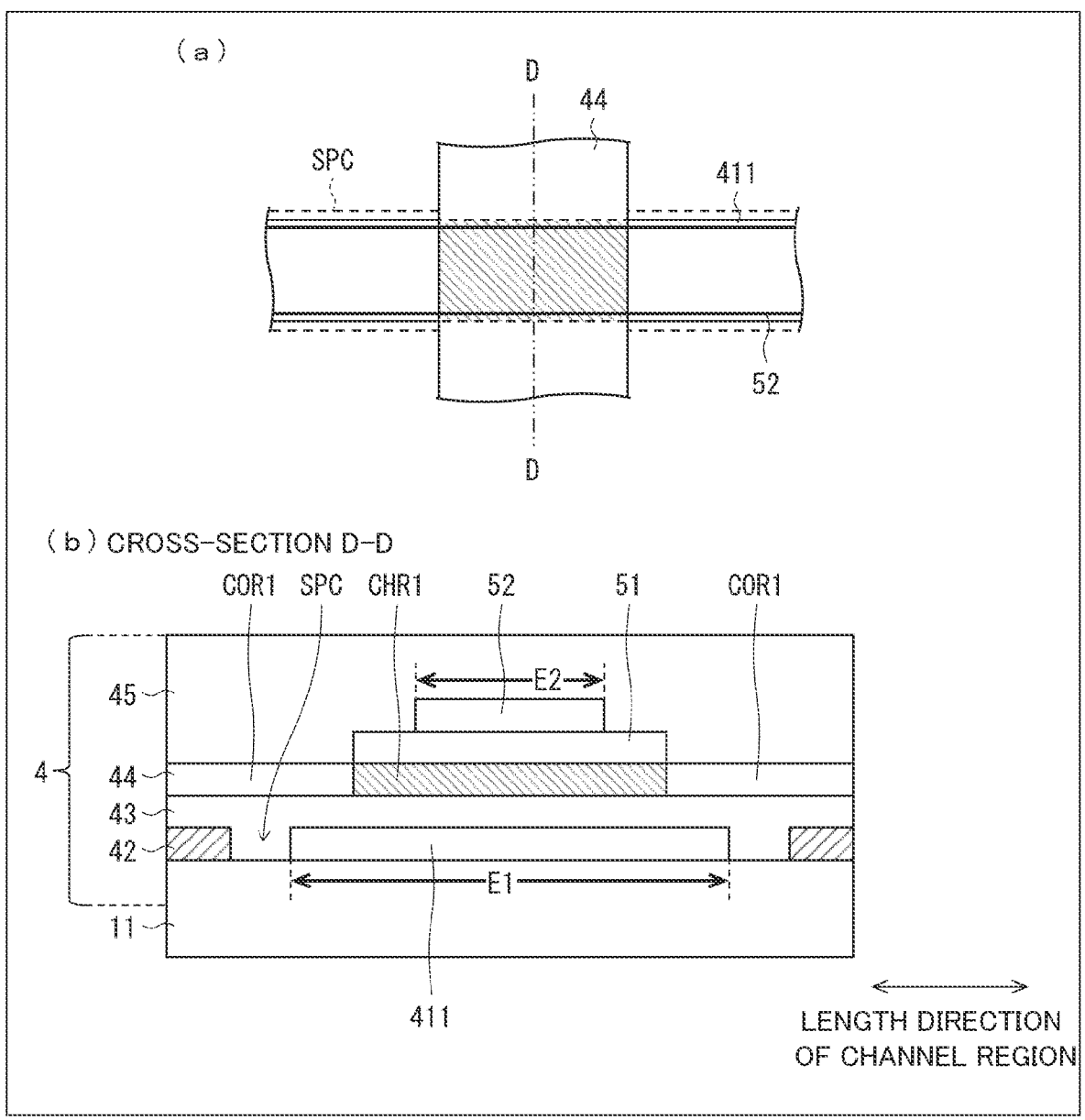
FIG. 16(a) is a schematic plan view partially illustrating a configuration of a modification of the thin-film transistor layer in the second embodiment.
FIG. 16(b) is a cross-sectional view of FIG. 16(a), taken along line D-D.

As illustrated in FIG. 16, the first gate electrode 411 (a length E1) may be longer in length direction of the first channel region CHR1 than the third gate electrode 52 (a length E2). Such a feature may be applicable to any of the drive transistor Td, the write transistor Tw, and the initialization transistor Ti. Note that a voltage is applied across the length direction of the first channel region CHR1. Hence, the feature is adopted preferably to the drive transistor Td, which, in particular, allows the first gate electrode 411 to be either supplied with a constant voltage or electrically connected to a source terminal, and applies a data signal voltage to the third gate electrode 52.

Example of Forming Thin-Film Transistor Layer

Figure 17:
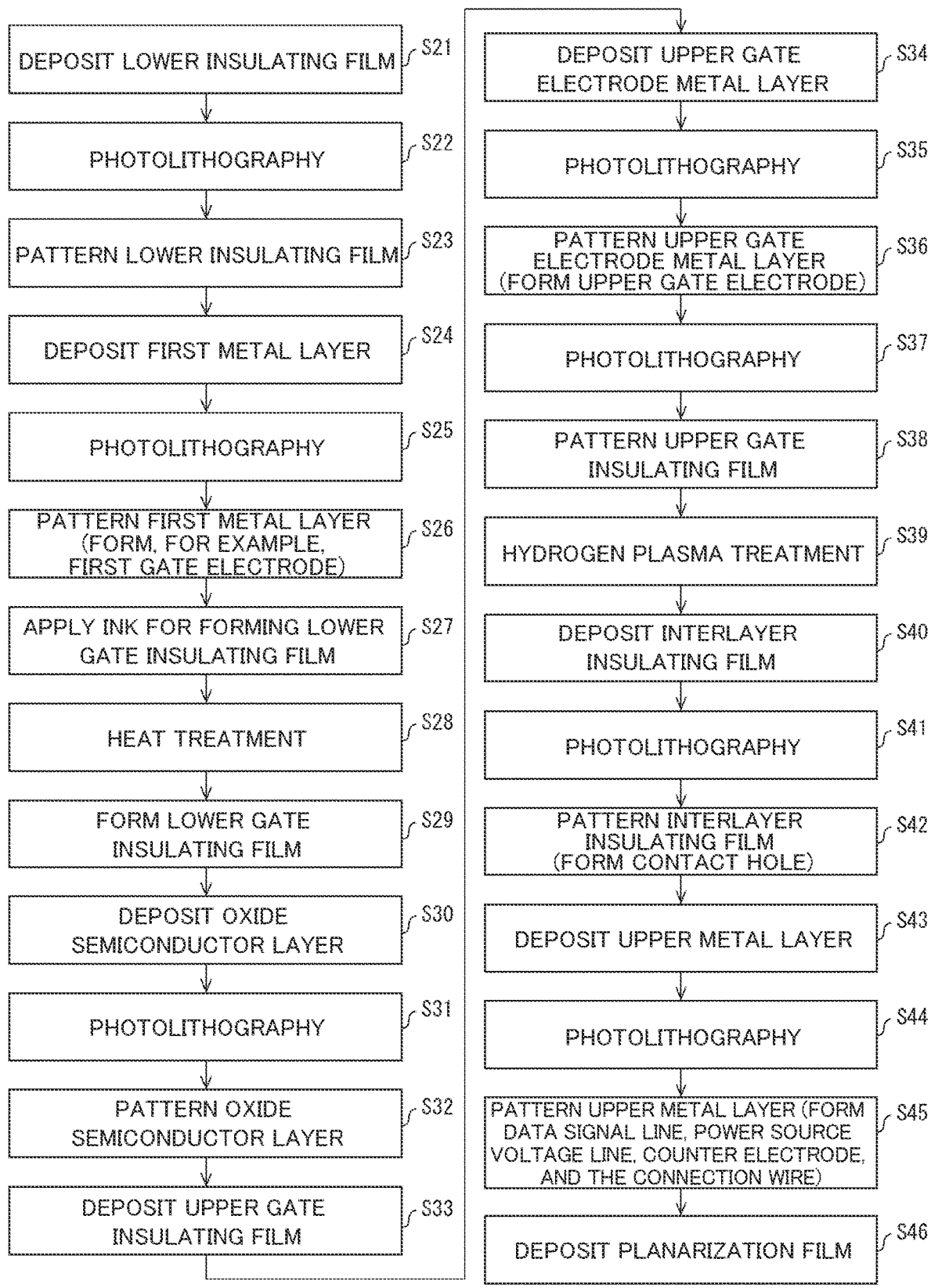
FIG. 17 is a flowchart showing steps to form the thin-film transistor layer in the second embodiment.

FIG. 17 is a flowchart showing steps to form the thin-film transistor layer 4 in the second embodiment. Steps S21 to S32 in FIG. 17 are the same as Steps S1 to S12 in FIG. 7 except a shape of a desired pattern formed in each layer.

After Step S32, at Step S33, the upper gate insulating film 51 is deposited on the lower gate insulating film 43 and the oxide semiconductor layer 44.

Figure 18:
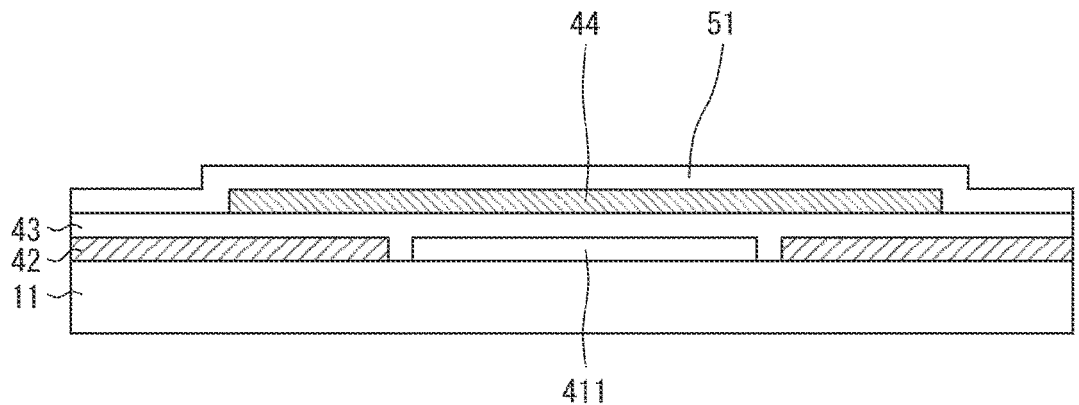
FIG. 18 is a cross-sectional view schematically illustrating a moment when Step S33 ends.

FIG. 18 is a cross-sectional view schematically illustrating a moment when Step S33 ends. For the sake of brevity, FIG. 18 and FIGS. 19 to 22 to be shown later illustrate only a portion corresponding to the drive transistor Td in FIG. 15(b) and surroundings of the portion. The upper gate insulating film 51 is formed to cover the lower gate insulating film 43 and the oxide semiconductor layer 44.

At Step S34, an upper gate electrode metal layer is deposited on the upper gate insulating film 51.

The upper gate insulating film 51 may be formed of, for example, a silicon oxide ($SiO_2$) film, a silicon nitride ($SiN_x$) film, or a multilayer film including these films. The metal layer may be appropriately made of such materials as aluminum (Al), molybdenum (Mo), tantalum (Ta), chromium (Cr), titanium (Ti), and gold (Au). Moreover, the metal layer may be a multilayer stack formed of these materials.

At Step S35, the metal layer is processed by photolithography. At Step 36, the metal layer is etched to have a desired pattern, so that the upper gate electrode UGE is formed. In other words, the third gate electrode 52 is formed.

Figure 19:
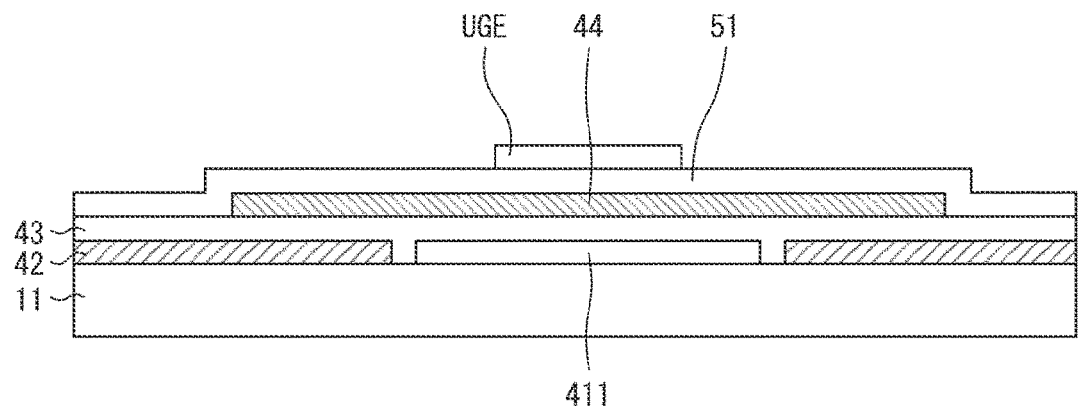
FIG. 19 is a cross-sectional view schematically illustrating a moment when Step S36 ends.

FIG. 19 is a cross-sectional view schematically illustrating a moment when Step S36 ends. The gate electrode UGE is provided above the first gate electrode 411.

At Step S37, the upper gate insulating film 51 is further processed by photolithography. At Step S38, the upper gate insulating film 51 is etched to have a desired pattern. At Step S39, the lower gate insulating film 43, the upper gate insulating film 51, and the upper gate electrode UGE constituting an upper surface after the etching are treated with hydrogen plasma.

Figure 20:
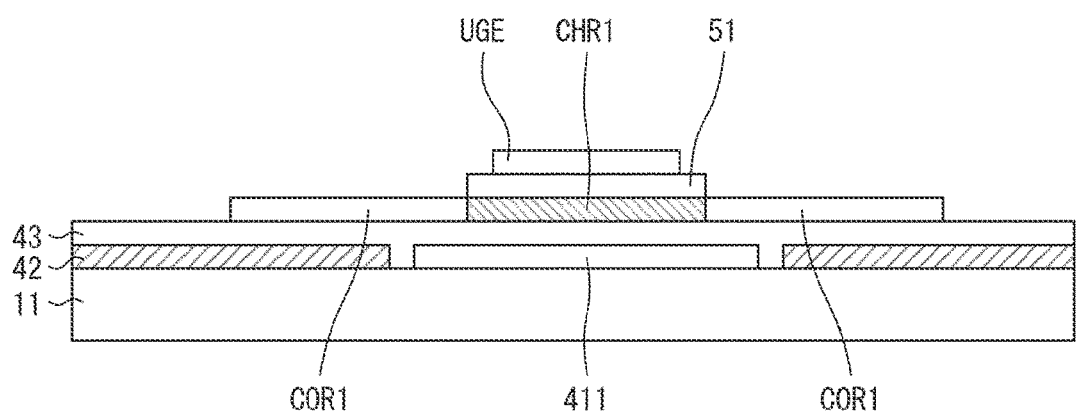
FIG. 20 is a cross-sectional view schematically illustrating a moment when Step S39 ends.

FIG. 20 is a cross-sectional view schematically illustrating a moment when Step S39 ends. The oxide semiconductor layer 44 includes: the first channel region CHR1; and the first conductor region COR1 provided to hold the first channel region CHR1.

At Step S40, on the upper surface treated with hydrogen plasma, the interlayer insulating film 45 is deposited. At Step S41, the lower gate insulating film 43 and the interlayer insulating film 45 are processed by photolithography. After that, the lower gate insulating film 43 is patterned to have a desired pattern. After that, the interlayer insulating film 45 is etched to have a desired pattern. Simultaneously, the lower insulating film 42 is etched. As a result, at Step S42, the contact hole CH is formed. Note that if the lower insulating film 42 and the interlayer insulating film 45 are formed of different inorganic insulating materials, the lower insulating film 42 and the interlayer insulating film 45 may be treated with different etching gases.

Figure 21:
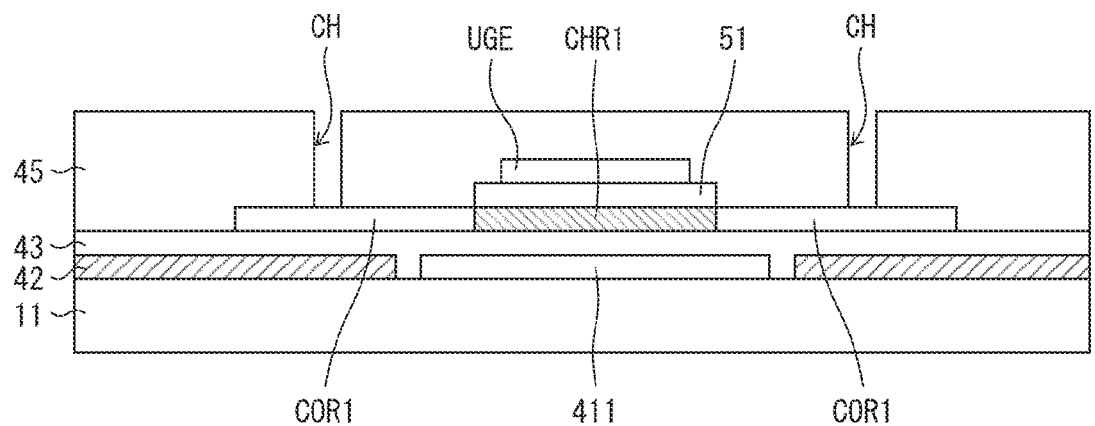
FIG. 21 is a cross-sectional view schematically illustrating a moment when Step S42 ends.

FIG. 21 is a cross-sectional view schematically illustrating a moment when Step S42 ends. As illustrated in FIG. 21, the contact holes CH are formed when Step S42 ends.

At Step S43, the upper metal layer 53 is deposited on the interlayer insulating film 45. At Step S44, the upper metal layer 53 processed by photolithography. At Step S45, the upper metal layer 53 is etched to have a desired pattern, so that the data signal line DL, the power source voltage line PL, the counter electrode OE, and the connection wire CW are formed on the interlayer insulating film 45. Furthermore, in depositing the upper metal layer 53, the material of the upper metal layer 53 enters the contact holes CH. Hence, these wires and electrode are electrically connected to, for example, wires in other layers (e.g. the upper gate electrode UGE, the first conductor region COR1, or the scanning signal line GL).

The upper metal layer 53 may be appropriately made of such materials as aluminum (Al), molybdenum (Mo), tantalum (Ta), chromium (Cr), titanium (Ti), and gold (Au). Moreover, the upper metal layer 53 may be a multilayer stack formed of these materials.

Figure 22:
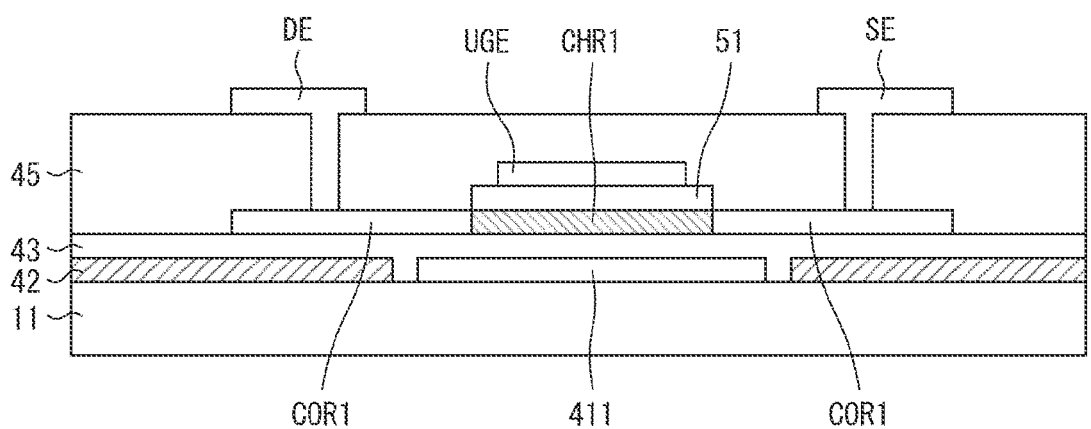
FIG. 22 is a cross-sectional view schematically illustrating a moment when Step S45 ends.

FIG. 22 is a cross-sectional view schematically illustrating a moment when Step S45 ends. The source electrode SE and the drain electrode DE are provided to electrically connect to the first channel regions CHR1 through the contact holes CH.

At Step S46, a planarization film is deposited.

SUMMARY

A display device according to a first aspect of the disclosure includes: a first gate electrode; a lower insulating film; a lower gate insulating film containing a metal oxide film; and an oxide semiconductor layer, all of which are provided on a substrate in a stated order; and a first transistor provided on the substrate and including the oxide semiconductor layer, the first transistor including one or more first transistors. The first transistor includes: a first channel region; a first conductor region holding the first channel region; and the first gate electrode across the lower gate insulating film from the first channel region. Between the lower insulating film and the first gate electrode, a clearance is provided. The clearance is filled with the lower gate insulating film.

Thanks to the above features, the lower insulating film is formed as a bank, making it possible to limit the amount of the applicable material leaving the first gate electrode. Hence, much of the applicable material can stay on the first gate electrode.

Consequently, thanks to the above features, the lower gate insulating film can have a portion with sufficient film thickness (the film thickness required for manufacturing the display device) on the first gate electrode. That is, the lower gate insulating film can be kept from decreasing in film thickness on the first gate electrode, thereby contributing to reducing the risk of decrease in breakdown voltage of the display device. Moreover, the amount of the applicable material to be used is reduced while the lower gate insulating film is provided with sufficient film thickness, contributing to reducing material costs.

In the display device, of a second aspect of the disclosure, according to the first aspect, a permittivity of the lower insulating film is lower than a permittivity of the lower gate insulating film.

In the display device, of a third aspect of the disclosure, according to the first aspect or the second aspect, a film thickness of the first gate electrode is greater than a film thickness of the lower insulating film. A film thickness of the lower gate insulating film on the first gate electrode is smaller than a film thickness of the lower gate insulating film on the lower insulating film.

The above features make it possible to reduce the thickness of the lower gate insulating film on the first gate electrode and across from the first channel region. Hence, when a transistor corresponding to the first gate electrode turns ON, a value of the current flowing in the transistor can be increased (highly ionized).

In the display device, of a fourth aspect of the disclosure, according to the first aspect or the second aspect, a film thickness of the first gate electrode is smaller than a film thickness of the lower insulating film. A film thickness of the lower gate insulating film on the first gate electrode is greater than a film thickness of the lower gate insulating film on the lower insulating film.

Such a feature makes it possible to reduce parasitic capacitance between the source electrode and the drain electrode.

The display device, of a fifth aspect of the disclosure, according to any one of the first to fourth aspects further includes: a source electrode and a drain electrode overlapping the first conductor region; and an interlayer insulating film provided above the lower gate insulating film, the source electrode, and the drain electrode. The oxide semiconductor layer corresponding to the first transistor is shaped into a single island.

The display device, of a sixth aspect of the disclosure, according to any one of the first to fifth aspects further includes: a first wire formed in the same layer, and of the same material, as the first gate electrode is; and a connection wire disposed above the lower gate insulating film. The first wire is at least partially covered with the lower insulating film and the lower gate insulating film, and electrically connected to the connection wire through a contact hole formed in the lower insulating film and the lower gate insulating film.

The display device, of a seventh aspect of the disclosure, according to the fifth aspect or the sixth aspect further includes a pixel circuit including: a drive transistor; a write transistor connected to a control terminal of the drive transistor; and a capacitor connected to the control terminal of the drive transistor. The write transistor is the first transistor.

In the display device, of an eighth aspect of the disclosure, according to the seventh aspect, the capacitor includes: the first gate electrode corresponding to the drive transistor; and a counter electrode across the lower gate insulating film from the first gate electrode.

In the display device, of a ninth aspect of the disclosure, according to the eighth aspect, the lower insulating film is provided further between the first gate electrode and the counter electrode.

The display device, of a tenth aspect of the disclosure, according to the seventh aspect further includes a second transistor provided on the substrate and including the oxide semiconductor layer. The second transistor includes: a second channel region; a second conductor region holding the second channel region; and a second gate electrode across the lower insulating film and the lower gate insulating film from the second channel region.

In the display device, of an eleventh aspect of the disclosure, according to the tenth aspect, the drive transistor is the second transistor.

Such features can reduce parasitic capacitance generated in the drive transistor, making it possible to increase an s-value and facilitate grayscale control (grayscale representation).

The display device, of a twelfth aspect of the disclosure, according to any one of the first to fourth aspects further includes: an upper gate insulating film; an upper gate electrode; an interlayer insulating film; and an upper metal layer, all of which are provided above the oxide semiconductor layer in a stated order. The first transistor further includes a third gate electrode included in the upper gate electrode, and provided across the upper gate insulating film from the first channel region. The first conductor region matches the third gate electrode.

In the display device, of a thirteenth aspect of the disclosure, according to the twelfth aspect, the first gate electrode is longer in length direction of the first channel region than the third gate electrode.

The display device, of a fourteenth aspect of the disclosure, according to the twelfth aspect or the thirteenth aspect further includes: a first wire formed in the same layer, and of the same material, as the first gate electrode is; and a connection wire formed in the same layer, and of the same material, as the upper metal layer is. The first wire is at least partially covered with the lower insulating film and the lower gate insulating film, and electrically connected to the connection wire through a contact hole formed in the lower insulating film and the lower gate insulating film.

The display device, of a fifteenth aspect of the disclosure, according to any one of the twelfth to fourteenth aspects further includes: a pixel circuit including: a drive transistor; a write transistor connected to a control terminal of the drive transistor; and a capacitor connected to the control terminal of the drive transistor.

In the display device, of a sixteenth aspect of the disclosure, according to the fifteenth aspect, the third gate electrode is electrically connected to the first gate electrode.

Thanks to the above features, the third gate electrode has the same potential as that of the first gate electrode, making it possible to improve the switching characteristics of the transistors.

In the display device, of a seventeenth aspect of the disclosure, according to the sixteenth aspect, the first transistor is the write transistor.

According to the above feature, the first transistor may be a write transistor, in view of improving the switching characteristics.

In the display device, of an eighteenth aspect of the disclosure, according to the fifteenth aspect, the third gate electrode is electrically connected to the third gate electrode corresponding to another pixel circuit adjacent to the pixel circuit.

Such a feature makes it possible to reduce variation in voltage threshold, possibly occurring between the transistors of the sub-pixels, for switching between ON and OFF of the transistors.

In the display device, of a nineteenth aspect of the disclosure, according to the eighteenth aspect, the first transistor is the drive transistor.

In the display device, of a twentieth aspect of the disclosure, according to the first to ninetieth aspects, the lower gate insulating film is formed of a high-k material, and contains a metal oxide.

The disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure. Moreover, the technical aspects disclosed in each embodiment may be combined to achieve a new technical feature.

The invention claimed is:

1. A display device, comprising:
a first gate electrode; a lower insulating film; a lower gate insulating film including a metal oxide film; and an oxide semiconductor layer, all of which are provided on a substrate in a stated order;
a first transistor provided on the substrate and including the oxide semiconductor layer, the first transistor including one or more first transistors,
the first transistor including: a first channel region; a first conductor region holding the first channel region; and the first gate electrode across the lower gate insulating film from the first channel region, and
between the lower insulating film and the first gate electrode, a clearance being provided, and the clearance being filled with the lower gate insulating film;
a source electrode and a drain electrode overlapping the first conductor region;
an interlayer insulating film provided above the lower gate insulating film, the source electrode, and the drain electrode, wherein
the oxide semiconductor layer corresponding to the first transistor is shaped into a single island;
a first wire formed in a same layer, and of a same material, as the first gate electrode; and
a connection wire disposed above the lower gate insulating film, wherein
the first wire is at least partially covered by the lower insulating film and the lower gate insulating film, and electrically connected to the connection wire through a contact hole formed in the lower insulating film and the lower gate insulating film.

2. The display device according to claim 1, wherein a permittivity of the lower insulating film is lower than a permittivity of the lower gate insulating film.

3. The display device according to claim 1, wherein, a film thickness of the first gate electrode is greater than a film thickness of the lower insulating film, and
a film thickness of the lower gate insulating film on the first gate electrode is smaller than a film thickness of the lower gate insulating film on the lower insulating film.

4. The display device according to claim 1, wherein, a film thickness of the first gate electrode is smaller than a film thickness of the lower insulating film, and
a film thickness of the lower gate insulating film on the first gate electrode is greater than a film thickness of the lower gate insulating film on the lower insulating film.

5. The display device according to claim 1, further comprising
a pixel circuit including: a drive transistor; a write transistor connected to a control terminal of the drive transistor; and a capacitor connected to the control terminal of the drive transistor, wherein
the write transistor is the first transistor.

6. A display device, comprising:
a first gate electrode; a lower insulating film; a lower gate insulating film including a metal oxide film; and an oxide semiconductor layer, all of which are provided on a substrate in a stated order;
a first transistor provided on the substrate and including the oxide semiconductor layer, the first transistor including one or more first transistors,
the first transistor including: a first channel region; a first conductor region holding the first channel region; and the first gate electrode across the lower gate insulating film from the first channel region, and
between the lower insulating film and the first gate electrode, a clearance being provided, and the clearance being filled with the lower gate insulating film;
a source electrode and a drain electrode overlapping the first conductor region;
an interlayer insulating film provided above the lower gate insulating film, the source electrode, and the drain electrode, wherein the oxide semiconductor layer corresponding to the first transistor is shaped into a single island; and
a pixel circuit including: a drive transistor; a write transistor connected to a control terminal of the drive transistor; and a capacitor connected to the control terminal of the drive transistor, wherein
the write transistor is the first transistor.

7. The display device according to claim 6, wherein
the capacitor includes: the first gate electrode corresponding to the drive transistor; and a counter electrode across the lower gate insulating film from the first gate electrode.

8. The display device according to claim 7, wherein
the lower insulating film is provided further between the first gate electrode and the counter electrode.

9. The display device according to claim 6, further comprising
a second transistor provided on the substrate and including the oxide semiconductor layer, wherein
the second transistor includes: a second channel region; a second conductor region holding the second channel region; and a second gate electrode across the lower insulating film and the lower gate insulating film from the second channel region.

10. The display device according to claim 9, wherein
the drive transistor is the second transistor.

11. A display device, comprising:
a first gate electrode; a lower insulating film; a lower gate insulating film including a metal oxide film; and an oxide semiconductor layer, all of which are provided on a substrate in a stated order;
a first transistor provided on the substrate and including the oxide semiconductor layer, the first transistor including one or more first transistors,
the first transistor including: a first channel region; a first conductor region holding the first channel region; and the first gate electrode across the lower gate insulating film from the first channel region, and
between the lower insulating film and the first gate electrode, a clearance being provided, and the clearance being filled with the lower gate insulating film;
a source electrode and a drain electrode overlapping the first conductor region;
an interlayer insulating film provided above the lower gate insulating film, the source electrode, and the drain electrode, wherein
the oxide semiconductor layer corresponding to the first transistor is shaped into a single island; and
an upper gate insulating film; an upper gate electrode; an interlayer insulating film; and an upper metal layer, all of which are provided above the oxide semiconductor layer in a stated order, wherein
the first transistor further includes a third gate electrode included in the upper gate electrode, and provided across the upper gate insulating film from the first channel region, and
the first conductor region matches the third gate electrode.

12. The display device according to claim 11, wherein
the first gate electrode is longer than the third gate electrode in a length direction of the first channel region.

13. The display device according to claim 11, further comprising:
a first wire formed in a same layer, and of a same material, as the first gate electrode; and a connection wire formed in a same layer, and of a same material, as the upper metal layer, wherein
the first wire is at least partially covered by the lower insulating film and the lower gate insulating film, and electrically connected to the connection wire through a contact hole formed in the lower insulating film and the lower gate insulating film.

14. The display device according to claim 11, further comprising:
a pixel circuit including: a drive transistor; a write transistor connected to a control terminal of the drive transistor; and a capacitor connected to the control terminal of the drive transistor.

15. The display device according to claim 14, wherein
the third gate electrode is electrically connected to another third gate electrode corresponding to another pixel circuit adjacent to the pixel circuit.

16. The display device according to claim 14, wherein
the first transistor is the drive transistor.

17. The display device according to claim 14, wherein
the third gate electrode is electrically connected to the first gate electrode.

18. The display device according to claim 14, wherein
the first transistor is the write transistor.

* * * * *